United States Patent
Wu et al.

(10) Patent No.: US 10,804,130 B2
(45) Date of Patent: Oct. 13, 2020

(54) STRUCTURE WITH MICRO DEVICE

(71) Applicant: PlayNitride Inc., Tainan (TW)

(72) Inventors: Chih-Ling Wu, Tainan (TW); Yi-Min Su, Tainan (TW); Yu-Yun Lo, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 16/212,694

(22) Filed: Dec. 7, 2018

(65) Prior Publication Data
US 2019/0189495 A1   Jun. 20, 2019

Related U.S. Application Data

(60) Provisional application No. 62/607,325, filed on Dec. 19, 2017.

(30) Foreign Application Priority Data

Jun. 5, 2018 (TW) .............................. 107119257 A

(51) Int. Cl.
   *H01L 33/38*   (2010.01)
   *H01L 21/683*  (2006.01)
   (Continued)

(52) U.S. Cl.
   CPC ...... *H01L 21/6835* (2013.01); *H01L 25/0753* (2013.01); *H01L 33/0093* (2020.05);
   (Continued)

(58) Field of Classification Search
   CPC ......... H01L 25/13; H01L 24/00; H01L 24/95; H01L 33/483; H01L 24/05; H01L 24/06;
   (Continued)

(56) References Cited

U.S. PATENT DOCUMENTS 10,403,799 B1 * 9/2019 Wu ..................... H01L 33/32
2013/0228793 A1   9/2013 Kim et al.
(Continued)

FOREIGN PATENT DOCUMENTS

CN   102520832   6/2012
CN   104680939   6/2015
(Continued)

OTHER PUBLICATIONS

"Office Action of Taiwan Related Application, application No. 107119254", dated Aug. 23, 2019, p. 1-p. 6.
(Continued)

*Primary Examiner* — Fernando L Toledo
*Assistant Examiner* — Valerie N Newton
(74) *Attorney, Agent, or Firm* — JCIPRNET

(57) ABSTRACT

A structure with micro device including a substrate, at least one micro device, and at least one holding structure is provided. The micro device having a top surface is disposed on the substrate, and the top surface is away from the substrate. The holding structure including at least one connecting portion and at least one holding portion is disposed on the substrate. The connecting portion is disposed on at least one edge of the micro device. The holding portion connects the connecting portion and extends to the substrate. From a top view direction, a width of the connecting portion gradually increases from the edge of the micro device to the holding portion.

21 Claims, 22 Drawing Sheets

(51) Int. Cl.
*H01L 25/075* (2006.01)
*H01L 33/58* (2010.01)
*H01L 33/62* (2010.01)
*H01L 33/00* (2010.01)
*H01L 33/48* (2010.01)

(52) U.S. Cl.
CPC .............. *H01L 33/38* (2013.01); *H01L 33/58* (2013.01); *H01L 33/62* (2013.01); *H01L 33/48* (2013.01); *H01L 2221/68354* (2013.01); *H01L 2221/68363* (2013.01); *H01L 2933/0033* (2013.01)

(58) Field of Classification Search
CPC ............... H01L 25/0753; H01L 33/095; H01L 221/68368; H01L 2224/05553; H01L 2224/05554; H01L 2224/95001; H01L 2924/00014; H01L 2924/12041
See application file for complete search history.

(56) References Cited

U.S. PATENT DOCUMENTS

| | | | |
|---|---|---|---|
| 2015/0236203 A1 | 8/2015 | Oh et al. | |
| 2015/0349205 A1 | 12/2015 | Chen et al. | |
| 2016/0072012 A1 | 3/2016 | Chen et al. | |
| 2016/0086855 A1* | 3/2016 | Bower | B81C 99/008 438/110 |
| 2016/0351548 A1 | 12/2016 | Chen et al. | |
| 2017/0062666 A1 | 3/2017 | Bang et al. | |
| 2019/0189602 A1 | 6/2019 | Wu et al. | |

FOREIGN PATENT DOCUMENTS

| | | |
|---|---|---|
| CN | 204668356 | 9/2015 |
| CN | 106816408 | 6/2017 |
| TW | 200644265 | 12/2006 |
| TW | 200950159 | 12/2009 |
| TW | I363437 | 5/2012 |
| TW | I455273 | 10/2014 |
| TW | 201620167 | 6/2016 |
| TW | 201701510 | 1/2017 |
| TW | 201705544 | 2/2017 |

OTHER PUBLICATIONS

"Office Action of Taiwan Related Application No. 107119255", dated Feb. 27, 2019, pp. 1-8.
Chih-Ling Wu, et al., "Structure With Micro Device," Unpublished U.S. Appl. No. 16/212,690, filed Dec. 7, 2018.
Chih-Ling Wu, et al., "Structure With Micro Device," Unpublished U.S. Appl. No. 16/212,697, filed Dec. 7, 2018.
Chih-Ling Wu, et al., "Structure With Micro Device," Unpublished U.S. Appl. No. 16/513,733, filed Jul. 17, 2019.
"Notice of Allowance of U.S. Appl. No. 16/212,697", dated Apr. 24, 2019, pp. 1-9.

* cited by examiner

STRUCTURE WITH MICRO DEVICE

CROSS-REFERENCE TO RELATED APPLICATION

This application claims the priority benefits of U.S. provisional application Ser. No. 62/607,325, filed on Dec. 19, 2017 and Taiwan application serial no. 107119257, filed on Jun. 5, 2018. The entirety of each of the above-mentioned patent applications is hereby incorporated by reference herein and made a part of this specification.

BACKGROUND OF THE INVENTION

Field of the Invention

The invention is related to a semiconductor structure, and particularly to a structure with micro device.

Description of Related Art

In current techniques, transfer of micro light emitting diode (LED) is conducted mainly through the means of electrostatic force or magnetic force to transfer the micro LED on a carrier to a receiving substrate. Typically, the micro LED is held through a holding structure such that the micro LED can be picked up more easily from the carrier as well as delivered and transferred to be placed on the receiving substrate; moreover, the quality of the micro LED is not easily affected by other factors through use of the holding structure to hold the micro LED in the transferring process. However, the size and shape of a contact area between the holding structure and the micro LED affect the yield rate of delivery and transfer of the micro LED. In light of the above, it has become an important issue for related industries to find out how to make the holding structure to temporarily hold the micro LED and make the micro LED to be delivered and transferred between the carrier and the receiving substrate more easily and effectively.

SUMMARY OF THE INVENTION

The invention provides a structure with micro device, capable of effectively improving yield rate of delivery and transfer of micro device.

According to the invention, a structure with micro device includes a substrate, at least one micro device and at least one holding structure. The micro device is disposed on the substrate. The micro device has a top surface away from the substrate. The holding structure is disposed on the substrate. The holding structure includes at least one connecting portion and at least one holding portion. The connecting portion is disposed on at least one edge of the micro device. The holding portion connects the connecting portion and extends to the substrate. From a top view direction, a width of the connecting portion is gradually increased from the edge of the micro device to the holding portion.

According to an embodiment of the invention, from the top view direction, the outer contour of the connecting portion of the holding structure is a curved contour.

According to an embodiment of the invention, from the top view direction, the outer contour of the connecting portion of the holding structure is a linear contour.

According to an embodiment of the invention, the micro device includes a first-type electrode and a second-type electrode, and the first-type electrode and the second-type electrode are disposed on a bottom surface opposite to the top surface.

According to an embodiment of the invention, a ratio of the orthogonal projection area of the holding structure on the top surface to the area of the top surface of the micro device is larger than or equal to 0.5 and smaller than 1.

According to an embodiment of the invention, the micro device includes a first-type electrode and a second-type electrode, and the first-type electrode or the second-type electrode is disposed on the top surface.

According to an embodiment of the invention, a ratio of the orthogonal projection area of the holding structure on the top surface to the area of the top surface of the micro device is larger than or equal to 0.01 and smaller than or equal to 0.5.

According to an embodiment of the invention, the holding structure further includes at least one covering portion. The covering portion is disposed on the top surface of the micro device, and the connecting portion is connected between the covering portion and the holding portion.

According to an embodiment of the invention, the central width of the covering portion is larger than a width of the connecting portion on a corresponding edge of the top surface.

According to an embodiment of the invention, the covering portion has a plurality of inflection points, and a width of the covering portion is gradually increased from the inflection points to the connecting portion.

According to an embodiment of the invention, the central width of the covering portion is smaller than of the width of the connecting portion on a corresponding edge of the top surface.

According to an embodiment of the invention, a width of the covering portion is gradually increased toward the connecting portion.

According to an embodiment of the invention, the at least one covering portion includes a plurality of covering portions, and the covering portions are separated from each other.

According to an embodiment of the invention, the smallest distances from the center of the top surface of the micro device to each of the covering portions are the same.

According to an embodiment of the invention, the smallest distance from the center of the top surface of the micro device to each of the covering portions is smaller than or equal to the shortest length of the half of the top surface.

According to an embodiment of the invention, a largest distance is formed from each of the covering portions to the edge of the top surface, and a ratio of the largest distance to the length of the corresponding edge of the micro device is smaller than or equal to 0.2.

According to an embodiment of the invention, a ratio of the width of the connecting portion at the edge to the length of the edge is in a range between 0.01 and 0.6.

According to an embodiment of the invention, the structure with micro device further includes at least one buffering structure. The buffering structure is disposed between the holding portion of the holding structure and the substrate, wherein the holding portion is connected to the substrate through the buffering structure.

According to an embodiment of the invention, the material of the holding structure is different from the material of the buffering structure, and the Young's modulus of the holding structure is larger than the Young's modulus of the buffering structure.

According to an embodiment of the invention, the buffering structure is away from the micro device.

According to an embodiment of the invention, a smallest distance is formed between the orthogonal projection of the buffering structure on the substrate and the orthogonal projection of the micro device on the substrate, and the smallest distance is smaller than or equal to 10 μm.

According to an embodiment of the invention, in a unit area, a ratio of the orthogonal projection area of the buffering structure on the substrate to the orthogonal projection area of the holding structure on the substrate is in a range between 0.2 and 0.9.

Based on the above, in the design of the structure with micro device of the invention, from the top view direction, the connecting portion of the holding structure is extended along a horizontal direction and connected between the covering portion and the holding portion, and the width change of the connecting portion is gradually increased from the edge of the micro device to the holding portion. That is to say, the width of the connecting portion of the holding structure at the edge of the micro device is substantially the narrowest (or the smallest). With such design, when the micro device is delivered and transferred between different temporary substrates to be applied to a micro device display, the breaking point of the holding structure can be as close to the edge or corner of the micro device as possible, thereby reducing the problem that the holding structure is not completely broken or remained, such that the yield rate of delivery and transfer of the micro LED can be improved.

In order to make the aforementioned features and advantages of the disclosure more comprehensible, embodiments accompanying figures are described in detail below.

DESCRIPTION OF EMBODIMENTS

The embodiments of the invention describe the structure of micro device (e.g., micro LED and micro chip) that is ready to be picked up and transferred to a circuit substrate. For example, a receiving substrate may be a display substrate, a light emitting substrate, a substrate having functional element such as transistor or integrated circuit (ICs) or a substrate having metal redistribution line, but the invention is not limited thereto. Although some embodiments of the invention focus on micro LED containing p-n diode, it should be understood that the embodiments of the invention are not limited thereto. Some embodiments may be applied to other micro semiconductor devices, and the devices are designed in this manner to control execution of predetermined electronic function (e.g., diode, transistor, integrated circuit) or photon function (e.g., LED, laser).

Figure 1A:
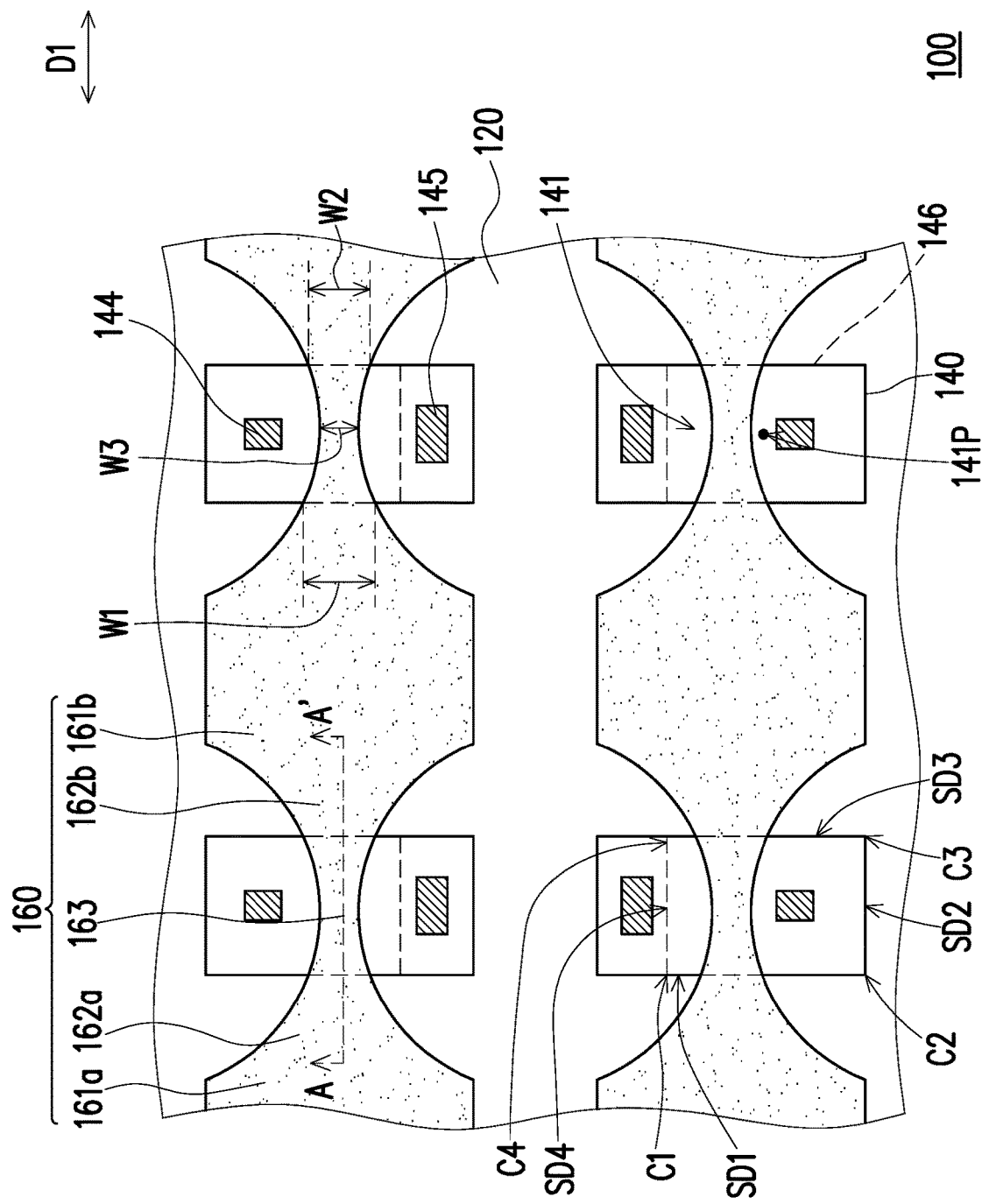
FIG. 1A is a schematic top view of a structure with micro device according to a first embodiment of the invention.
Figure 1B:
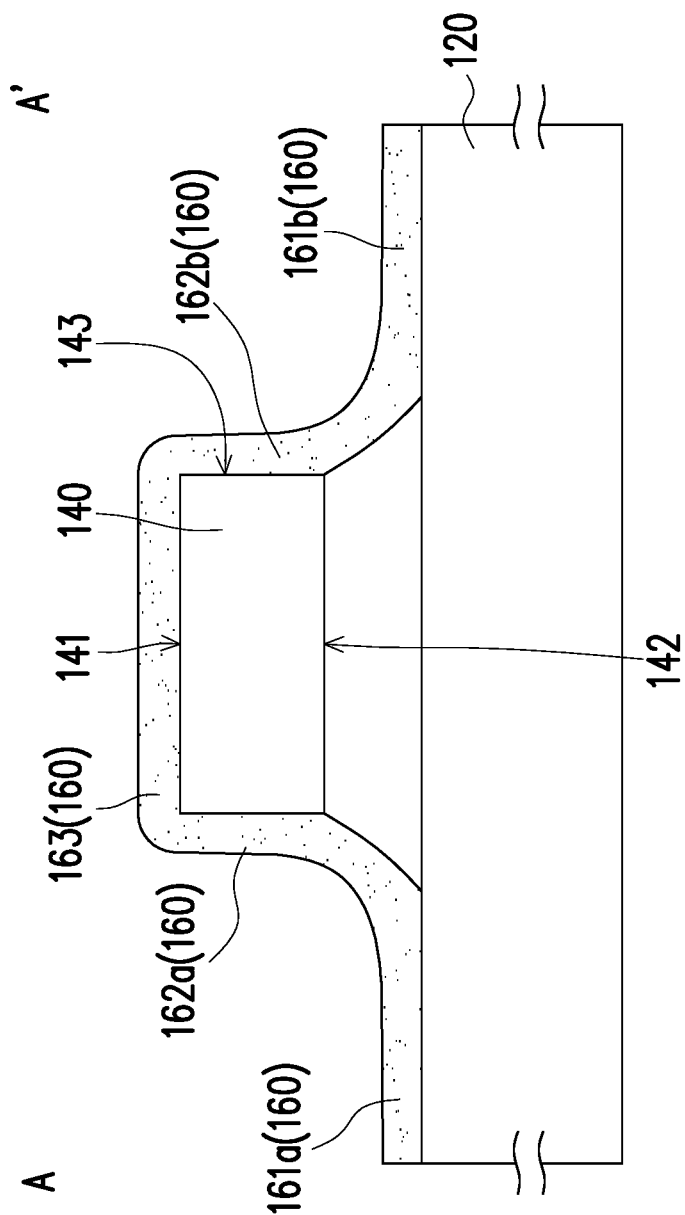
FIG. 1B is a schematic cross-sectional view of the structure with micro device in FIG. 1A.

FIG. 1A is a schematic top view of a structure with micro device according to a first embodiment of the invention. FIG. 1B is a schematic cross-sectional view of the structure with micro device in FIG. 1A. It should be indicated that a structure with micro device 100 in FIG. 1B is illustrated along line A-A' of FIG. 1A.

Referring to FIG. 1A and FIG. 1B, the structure with micro device 100 in the embodiment includes a substrate 120, at least one micro device 140 (a plurality of micro devices are exemplified in FIG. 1A) and at least one holding structure 160 (a plurality of holding structures are exemplified in FIG. 1A). The micro device 140 is disposed on the substrate 120. The micro device 140 has a top surface 141, a bottom surface 142, a peripheral surface 143, a first-type electrode 144 and a second-type electrode 145. The top surface 141 and the bottom surface 142 are opposite to each other, and the top surface 141 is farther away from the substrate 120 than the bottom surface 142. The peripheral surface 143 connects the top surface 141 and the bottom surface 142. The holding structure 160 is disposed on the substrate 120, and is not directly in contact with the first-type electrode 144 and the second-type electrode 145 of corresponding micro device 140. Each of the holding structures 160 includes at least one covering portion 163 (one covering portion 163 is exemplified in FIG. 1A), at least one connecting portion (two connecting portions 162a, 162b are exemplified in FIG. 1A) and at least one holding portion (two holding portions 161a, 161b are exemplified in FIG. 1A). The covering portion 163 is directly in contact with a partial top surface 141 of the micro device 140. The connecting portions 162a and 162b are respectively connected to the covering portion 163 from two opposite edges SD1 and SD3 of the micro device 140. The holding portions 161a and 161b connect the connecting portions 162a and 162b and extend to the substrate 120. As shown in FIG. 1A, two adjacent micro devices 140 are connected together through the holding portions 161a and 161b of the corresponding holding structure 160. Meanwhile, from a top view direction, the connecting portions 162a and 162b are extended along a horizontal direction D1 parallel with the extending direction of the substrate 120 and connected between the covering portion 163 and the holding portions 161a and 161b, and width change of the connecting portions 162a and 162b is gradually increased from the two opposite edges SD1 and SD3 of the micro device 140 to the corresponding holding portions 161a and 161b.

Specifically, the substrate 120 is a temporary substrate that may have fixity and flat surface such as a plastic substrate, a glass substrate or a sapphire substrate, the invention is not limited thereto. As shown in FIG. 1A, from the top view direction, the top surface 141 of the micro device 140 has four edges SD1, SD2, SD3, SD4 and four corners C1, C2, C3, C4 constructed along with the edges SD1, SD2, SD3, SD4. The edge SD1 and the edge SD3 of the top surface 141 of the micro device 140 are disposed opposite to each other, and the edge SD2 and the edge SD4 are disposed opposite to each other. In the embodiment, the lengths of the edge SD1 and the edge SD3 are longer than the lengths of the edge SD2 and the edge SD4. In other words, the counter of the micro device 140 viewed from a top view direction is specifically a rectangular shape, the invention is not limited thereto. In other embodiments, the counter of the micro device 140 viewed from the top may be other suitable shapes such as a trapezoidal shape or other suitable shapes. It should be indicated that, as shown in FIG. 1A, the top surface 141 of the micro device 140 refers to the surface corresponding to the position of a light emitting layer 146 of the micro device 140.

In the embodiment, the first-type electrode 144 of the micro device 140 is located on the top surface 141. In other words, the micro device 140 of the embodiment is substantially a horizontal-type micro device. Certainly, in other embodiments that are not shown, it may be that the second-type electrode 145 is disposed on the top surface 141, the invention is not limited thereto. Herein, the first-type electrode 144 is, for example, a p-type electrode, and the second-type electrode 145 is, for example, an n-type electrode. However, in other embodiments, the first-type electrode 144 may be an n-type electrode, and the second-type electrode 145 may be a p-type electrode, the invention provides no limitation thereto. In other embodiments, the micro device 140 may be in the form of a horizontal-type micro light emitting diode or other types of micro light emitting diode. Herein, the micro device 140 is, for example, a micro light emitting diode, and a largest size of the micro device 140 is smaller than or equal to 100 μm so as to be subsequently transferred to be integrated and assembled to a heterogeneous integrating system, including substrates of any size ranging from micro display to a display with large area. In other embodiments that are not shown, the micro device 140 may be a micro integrated circuit (micro IC), a micro laser diode (micro LD) or a micro sensor and so on, the invention provides no limitation thereto.

Referring to FIG. 1A, the connecting portion 162a of the holding structure 160 is connected to one side of the covering portion 163 from the edge SD1 of the top surface 141 of the micro device 140, and the width change of the connecting portion 162a of the holding structure 160 is gradually increased from the edge SD1 of the micro device 140 to the holding portion 161a. The connecting portion 162b of the holding structure 160 is connected to another side of the covering portion 163 through the edge SD3 of the top surface 141 of the micro device 140, and the width change of the connecting portion 162b is gradually increased from the edge SD3 of the micro device 140 to the holding portion 161b. In other words, the connecting portion 162a has a smallest width W1 on the corresponding edge Si of the top surface 141 of the micro device 140, and the connecting portion 162b has a smallest width W2 on the corresponding edge SD3 of the top surface 141 of the micro device 140. Preferably, a ratio of the smallest widths W1 and W2 of the connecting portions 162a and 162b at the edges SD1 and SD3 to the lengths of the corresponding edges SD1 and SD3 is in a range between 0.01 and 0.6. When the ratio is smaller than 0.01, the holding structure 160 cannot effectively hold the micro device 140, that is, the holding force provided by the holding structure 160 is not big enough. On the contrary, when the ratio is larger than 0.6, the holding force provided by the holding structure 160 is too large, which causes that the micro device 140 cannot be smoothly picked up from the substrate 120. The smallest widths W1 and W2 are, for example, smaller than or equal to 20 μm. More specifically, from the top view direction, the outer contour of the connecting portions 162a and 162b of the holding structure 160 of the embodiment is a curved contour, which should not be construed as a limitation to the invention. It should be pointed out that the ratio of the orthogonal projection area of the holding structure 160 on the top surface 141 to the surface area of the top surface 141 of the micro device 140 is, for example, larger than or equal to 0.01 and smaller than or equal to 0.6. When the ratio is smaller than 0.01, the holding force provided by the holding structure 160 is not big enough. When the ratio is larger than 0.6, it is likely that the holding structure 160 is in contact with the first-type electrode 144, which subsequently affects the yield rate of transferring the micro device to a circuit substrate (not shown).

It should be indicated that, when the micro device 140 is picked up from the substrate 120, the force for picking up (e.g., press-down force or pull-up force) causes the holding structure 160 to break. Since the positions of the smallest widths W1 and W2 of the connecting portions 162a and 162b are at the edges SD1 and SD3 of the corresponding micro device 140, it is possible that the breaking point of the holding structure 160 can be substantially located at or as close to the edges SD1 and SD3 of the micro device 140 as possible, thereby reducing the problem that the holding structure 160 is not completely broken or remained, such that the yield rate of delivery and transfer of the micro device 140 can be improved.

In some embodiments, if the connecting portions 162*a* and 162*b* of the holding structure 160 directly cover one of or a plurality of corners C1, C2, C3, C4 of the micro device 140, it is possible that the connecting portions 162*a* and 162*b* can have the smallest width in the covered corners C1, C2, C3, C4 or the corresponding edges SD1, SD2, SD3, SD4 (e.g., edges SD1, SD4 corresponding to corner C1), such that the yield rate of delivery and transfer of the micro device 140 can be improved.

Further referring to FIG. 1A and FIG. 1B, in the embodiment, the connecting portions 162*a* and 162*b* of the holding structure 160 are further directly in contact with the peripheral surface 143 of the micro device 140, the invention is not limited thereto. From the top view direction, the covering portion 163 of the holding structure 160 is continuously connected to the top surface 141 of the micro device 140, and the width change of the covering portion 163 is gradually decreased from the connecting portions 162*a* and 162*b* to a center 141P of the top surface 141 of the micro device 140. In other words, a central width W3 of the covering portion 163 is smaller than the width (i.e., smallest widths W1, W2) of the connecting portions 162*a* and 162*b* at the corresponding edges SD1 and SD3 of the top surface 141. In this manner, during the exposure and etching process for forming the holding structure 160, even if a slight shift is occurred unexpectedly, e.g., shift to the direction D1, the holding structure 160 can still be disposed on the top surface 141 of the micro device 140 without being shifted to other position, and the connecting portions 162*a* and 162*b* of the holding structure 160 can have the narrowest widths W1 and W2 between the edges SD1 and SD3 of the micro device 140 and the holding portions 161*a* and 161*b*, such that the process window of the holding structure 160 can be enhanced.

In the embodiment, the holding portions 161*a* and 161*b* of the holding structure 160 are directly in contact with the substrate, but the invention is not limited thereto. Additionally, there may be no component provided between the micro device 140 and the substrate 120 (e.g., there is air space/gas space between the micro device 140 and the substrate 120 in a non-vacuum state), which is still within the protection range of the invention.

It is to be explained that, the following embodiment has adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Figure 2A:
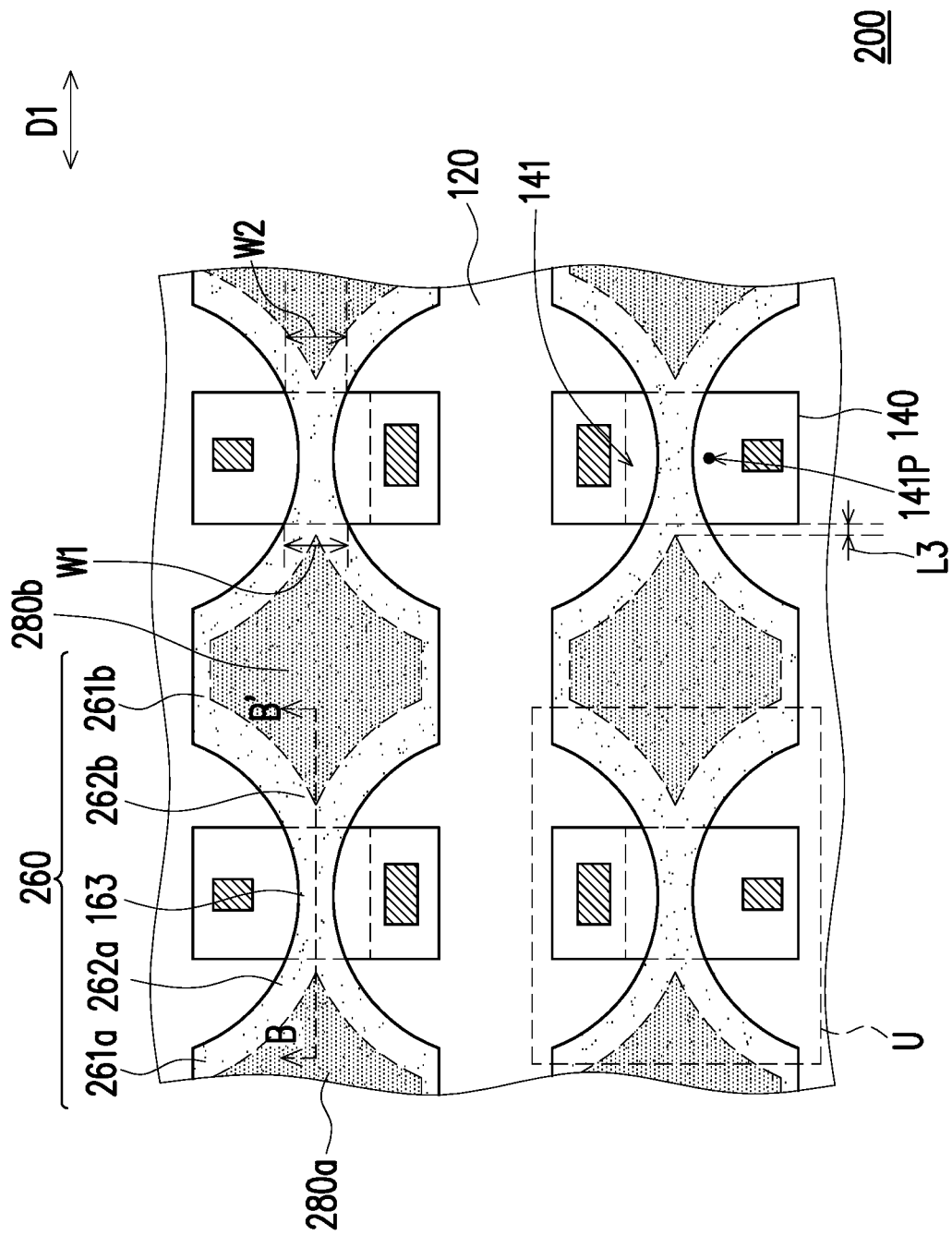
FIG. 2A is a schematic top view of a structure with micro device according to a second embodiment of the invention.
Figure 2B:
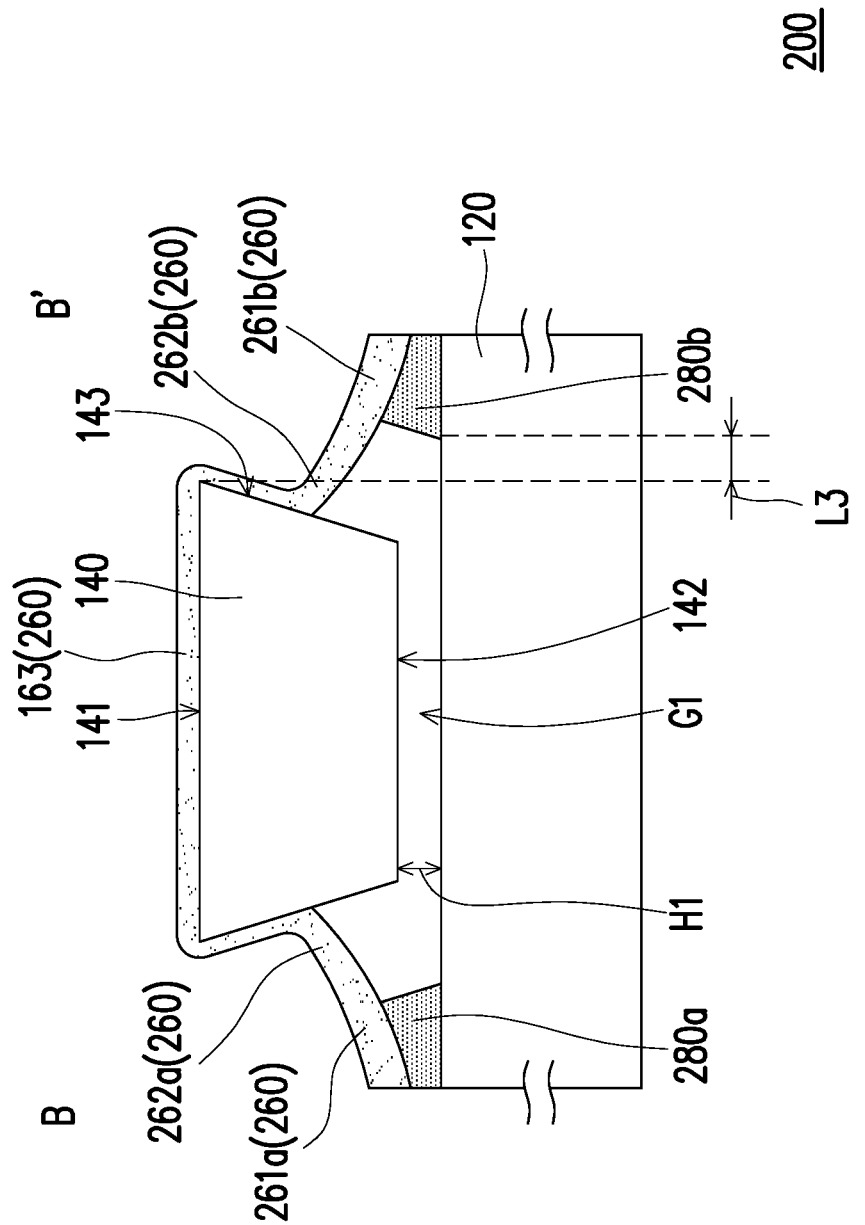
FIG. 2B is a schematic cross-sectional view of the structure with micro device in FIG. 2A.

FIG. 2A is a schematic top view of a structure with micro device according to a second embodiment of the invention. FIG. 2B is a schematic cross-sectional view of the structure with micro device in FIG. 2A. It should be pointed out that a structure with micro device 200 in FIG. 2B is illustrated along line B-B' of FIG. 2A. The structure with micro device 200 in the embodiment is similar to the structure with micro device 100 in the first embodiment, and the difference between the two is that the structure with micro device 200 further includes at least one buffering structure (a plurality of buffering structures 280*a*, 280*b* are exemplified in FIG. 2A). The buffering structures 280*a* and 280*b* are disposed between the holding portions 261*a* and 261*b* of the holding structure 260 and the substrate 120, wherein the holding portions 261*a* and 261*b* are connected to the substrate 120 through the buffering structures 280*a* and 280*b*.

Specifically, the buffering structures 280*a* and 280*b* are far away from the micro device 140; that is, the buffering structures 280*a* and 280*b* are not directly in contact with the micro device 140. Two opposite sides of the buffering structures 280*a* and 280*b* are respectively directly in contact with a holding structure 260 and the substrate 120. In other words, the holding structure 260 of the embodiment is not directly in contact with the substrate 120 but connected to the substrate 120 through the buffering structures 280*a* and 280*b*. Herein, the orthonogal projection of the holding structure 260 on the substrate 120 overlaps the orthogonal projection of the buffering structures 280*a* and 280*b* on the substrate 120. Preferably, in a unit area U, a ratio of the orthogonal projection area of the buffering structures 280*a* and 280*b* on the substrate 120 to the orthogonal projection area of the holding structure 260 on the substrate 120 is, for example, in a range between 0.2 and 0.9. When the ratio is smaller than 0.2, the buffering force of the buffering structure is not big enough; when the ratio is larger than 0.9, the connection between the buffering structure and the holding structure is too big and affects the subsequent picking-up process. More preferably, in the unit area U, a ratio of the orthogonal projection area of the buffering structures 280*a* and 280*b* on the substrate 120 to the orthogonal projection area of the holding portions 261*a* and 261*b* corresponding to the position of the buffering structures 280*a* and 280*b* on the substrate 120 is, for example, in a range between 0.5 and 0.9, such that the buffering structures 280*a* and 280*b* can provide a wider range of buffer without affecting subsequent picking-up process.

In the embodiment, the material of the holding structure 260 is different from the material of the buffering structures 280*a* and 280*b*, and the Young's modulus of the holding structure 260 is larger than the Young's modulus of the buffering structures 280*a* and 280*b*, such that the buffering structures 280*a* and 280*b* have buffering function. Herein, the material of the holding structure 260 is, for example, an inorganic material, and the material of the buffering structures 280*a* and 280*b* is, for example, an organic material.

As shown in FIG. 2A, the orthogonal projection of the buffering structures 280*a* and 280*b* on the substrate 120 does not overlap the orthogonal projection of the micro device 140 on the substrate 120. Therefore, the buffering structures 280*a* and 280*b* can absorb the external force that is applied to the holding structure 260 when holding the micro device 140 in the delivering and transferring process, thereby improving the yield rate of delivery and transfer without affecting the picking-up yield rate of the micro device 140. Preferably, the orthogonal projection of the buffering structures 280*a* and 280*b* on the substrate 120 is spaced apart from the orthogonal projection of the micro device 140 on the substrate 120 by a smallest distance L3. The smallest distance L3 may be smaller than or equal to 10 μm, the invention provides no limitation thereto.

Additionally, as shown in FIG. 2B, there is an air gap G1 between the holding structure 260, the substrate 120, the micro device 140 and the buffering structures 280*a* and 280*b* in the embodiment. Herein, the connecting portions 262*a* and 262*b* of the holding structure 260 do not completely cover the peripheral surface 143 of the micro device 140. A vertical distance H1 between the micro device 140 and the substrate 120 is designed based on the height of the micro device 140. Preferably, the vertical distance H1 is larger than 0 and smaller than 0.5 times the height of the micro device 140. If the vertical distance H1 is larger than 0.5 times the height of the micro device 140, the height difference of the holding structure 260 is too large, as a result, the holding structure is difficult to be manufactured and might be broken easily. Generally speaking, the vertical distance H1 is in a range between 0.1 pm and 5 μm.

Figure 3:
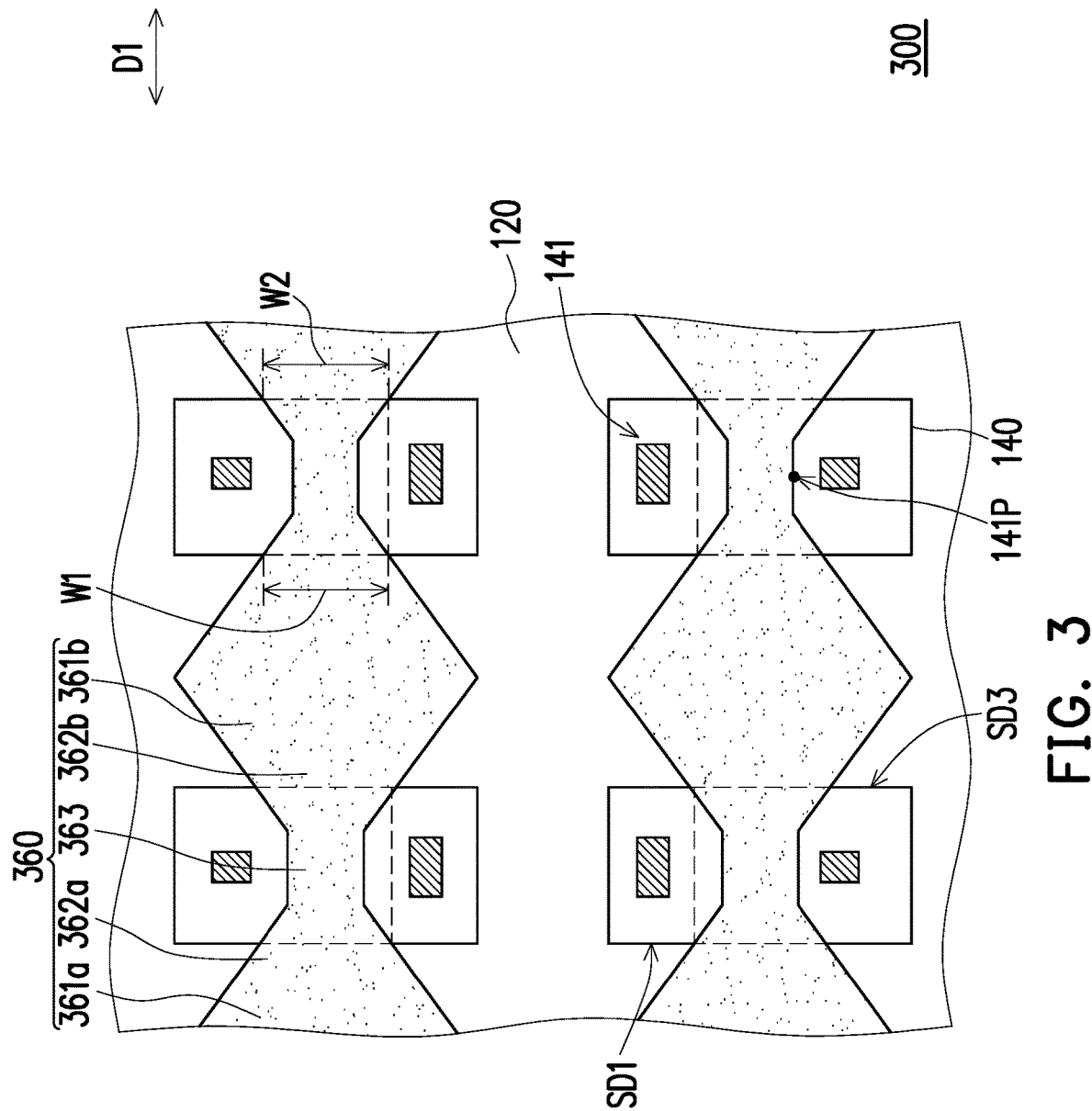
FIG. 3 is a schematic top view of a structure with micro device according to a third embodiment of the invention.

FIG. 3 is a schematic top view of a structure with micro device according to a third embodiment of the invention. A structure with micro device 300 in the embodiment is similar to the structure with micro device 100 in the first embodiment, and the difference between the two is that the outer contours of connecting portions 362a and 362b of a holding structure 360 in the embodiment are linear contours.

Specifically, from the top view direction, the shape constructed by a covering portion 363, the connecting portions 362a and 362b and holding portions 361a and 361b is, for example, a dumbbell shape. The holding structure 360 is continuously connected to the top surface 141 of the micro device 140, and the width change of the covering portion 363 from the connecting portions 362a and 362b to the center 141P of the top surface 141 of the micro device 140 is gradually decreased at first and then becomes consistent. In this manner, in the exposure and etching process for forming the holding structure 360, even if a slight shift is occurred unexpectedly, for example, a shift in the direction D1, the holding structure 360 can still be disposed on the top surface 141 of the micro device 140 without being shifted to other position, and the connecting portions 362a and 362b of the holding structure 360 can have the narrowest width between the edges SD1 and SD3 of the micro device 140 and the holding portions 361a and 361b (i.e., the smallest widths W1, W2), thereby enhancing the process window of the holding structure 360.

Figure 4A:
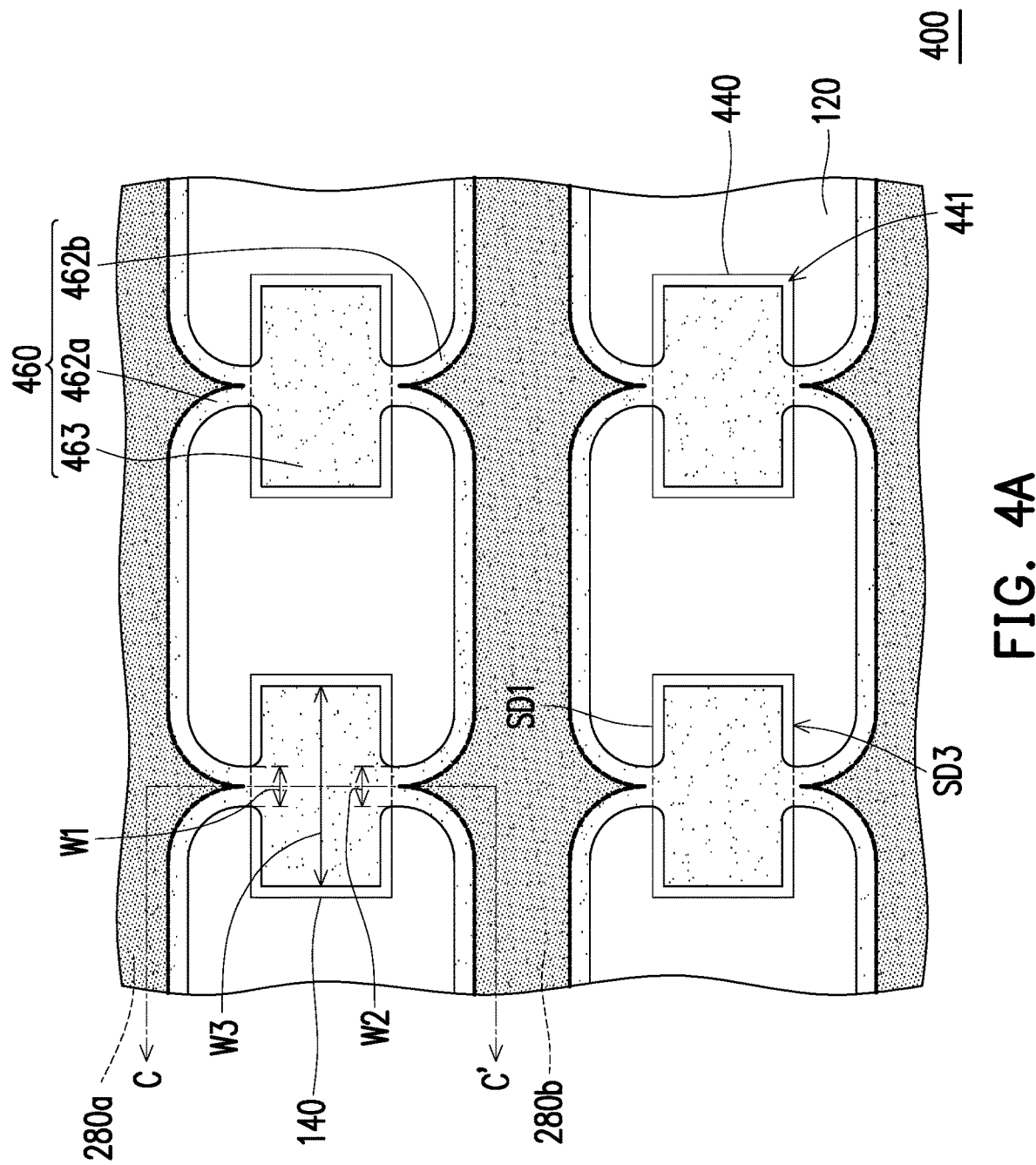
FIG. 4A is a schematic top view of a structure with micro device according to a fourth embodiment of the invention.
Figure 4B:
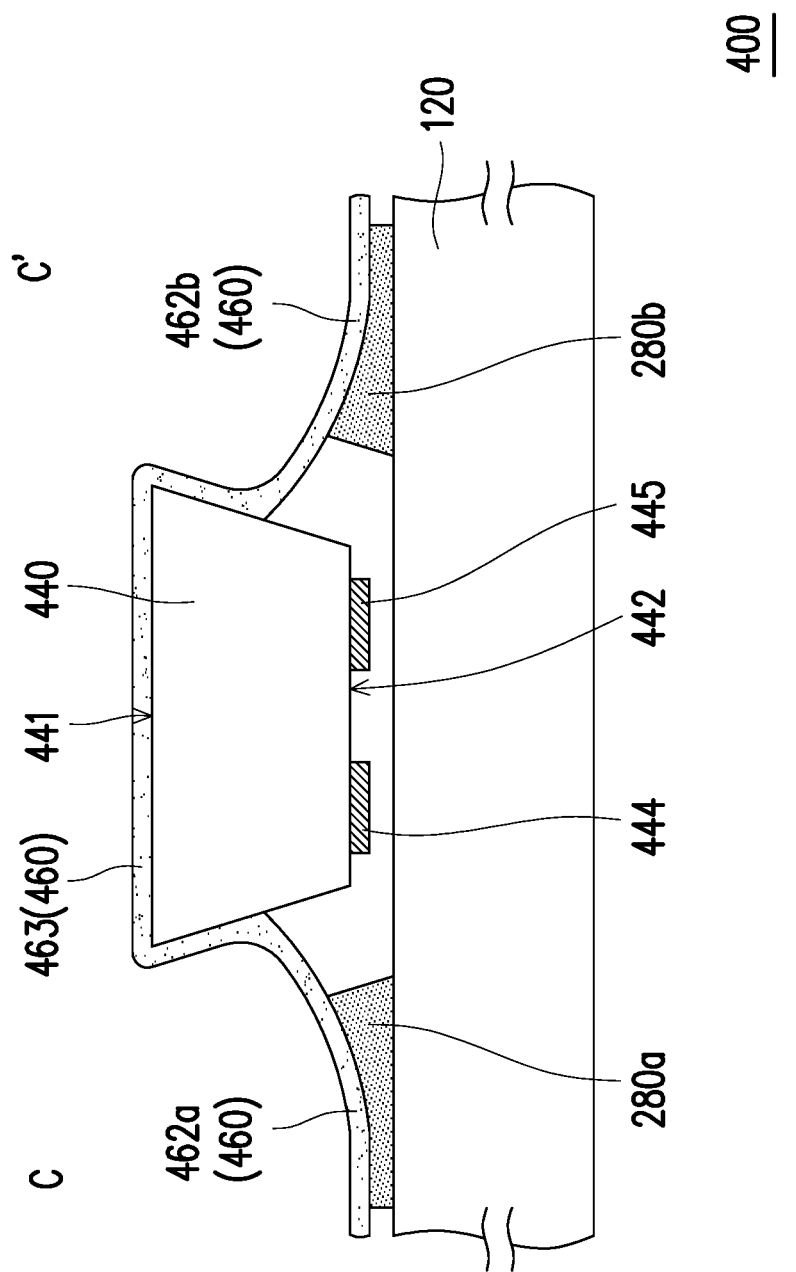
FIG. 4B is a schematic cross-sectional view of the structure with micro device in FIG. 4A.

FIG. 4A is a schematic top view of a structure with micro device according to a fourth embodiment of the invention. FIG. 4B is a schematic cross-sectional view of the structure with micro device in FIG. 4A. It should be indicted that a structure with micro device 400 in FIG. 4B is illustrated along line C-C' of FIG. 4A. The structure with micro device 400 in the embodiment is similar to the structure with micro device 200 of the second embodiment, and the difference between the two is that a first-type electrode 444 and a second-type electrode 445 of a micro device 440 of the embodiment are disposed on the same surface. Herein, the first-type electrode 444 and the second-type electrode 445 of the micro device 440 are disposed on a bottom surface 442. The shape of a holding structure 460 is, for example, a strap shape. Specifically, from the top view direction, the holding structure 460 is continuously connected to the top surface 441 of the micro device 440, and the central width W3 of a covering portion 463 is larger than widths (i.e., smallest widths W1, W2) of the connecting portions 462a and 462b on the corresponding edges SD1 and SD3 of the top surface 441. Herein, preferably, a ratio of the orthogonal projection area of the holding structure 460 on the top surface 441 of the micro device 440 to a surface area of the top surface 441 of the micro device 440 is larger than or equal to 0.5 and smaller than 1. Preferably, a ratio of the orthogonal projection area of the holding structure 460 on the top surface 441 of the micro device 440 to the surface area of the top surface 441 of the micro device 440 is larger than 0.7 and smaller than 1. It should be pointed out that, since the covering portion 463 of the holding structure 460 in the embodiment is distributed on nearly the overall top surface 441 of the micro device 440, the flatness of the micro device 440 can be increased in subsequent transfer process.

Figure 5:
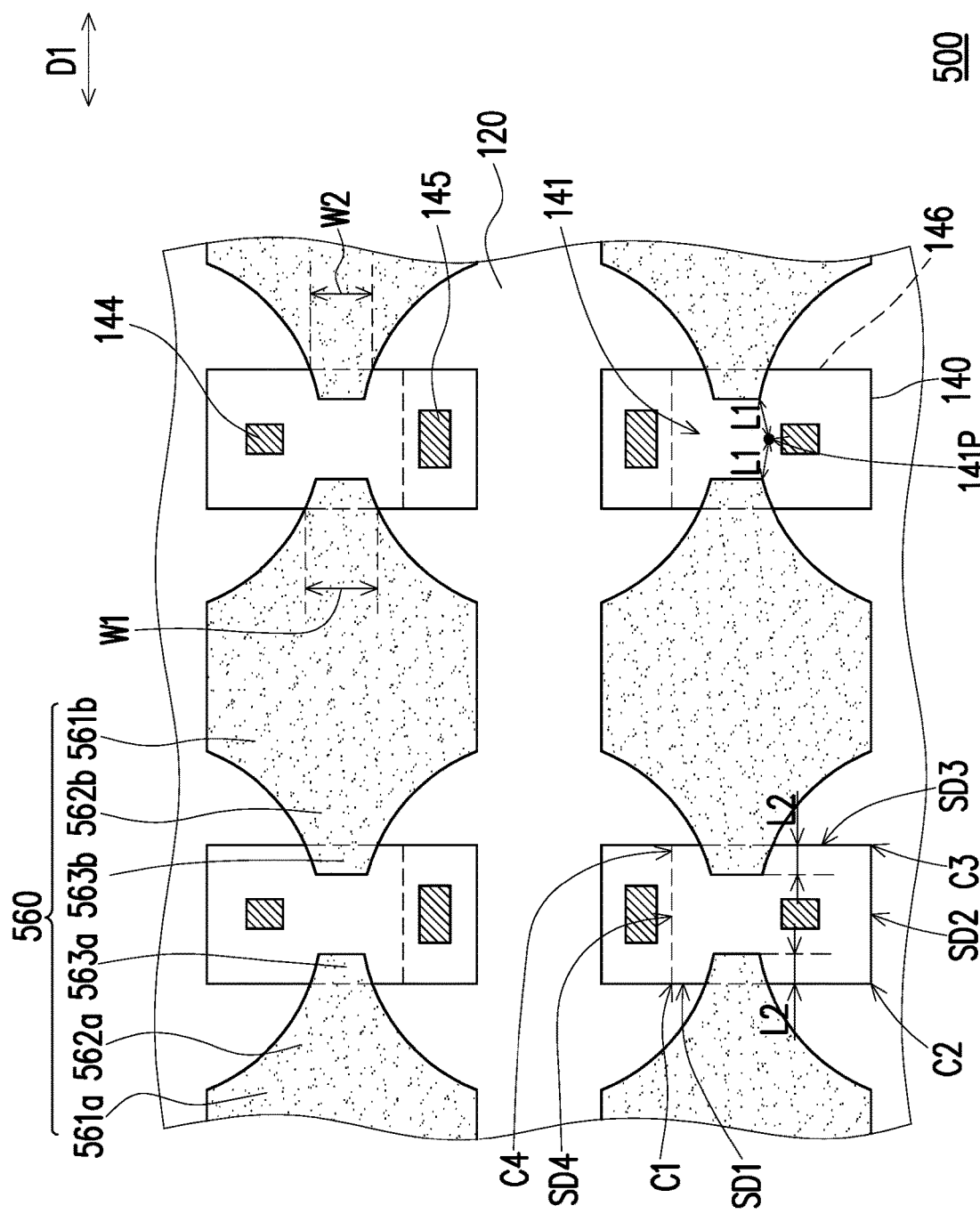
FIG. 5 is a schematic top view of a structure with micro device according to a fifth embodiment.

FIG. 5 is a schematic top view of a structure with micro device according to a fifth embodiment. A structure with micro device 500 in the embodiment is similar to the structure with micro device 100 in the first embodiment, and the difference between the two is that each of holding structures 560 of the embodiment has two covering portions 563a and 563b separated from each other. In other words, the structure of the covering portions 563a and 563b of the embodiment is a non-continuous structure.

More specifically, the two covering portions 563a and 563b of the holding structure 560 are respectively disposed on two opposite edges SD1 and SD3, and a connecting portion 562a has the smallest width W1 at the corresponding edge SD2 of the top surface 141 of the micro device 140, and a connecting portion 562b has the smallest width W2 at the corresponding edge SD4 of the top surface 141 of the micro device 140. The width change of the covering portions 563a and 563b from the corresponding connecting portions 562a and 562b to the center 141P of the top surface 141 of the micro device 140 is gradually decreased, thereby improving the process window of the holding structure 560.

From the top view direction, the holding structure 560 does not overlap the center 141P of the top surface 141 of the micro device 140, and the smallest distances L1 from the center 141P of the top surface 141 of the micro device 140 to each of the covering portions 563a and 563b may be the same, the invention provides no limitation thereto. Preferably, the distances L1 from the center 141P of the top surface 141 of the micro device 140 to each of the covering portions 563a and 563b may be smaller than or equal to the lengths of half of the edges SD2 and SD4, such that a better holding force can be attained, the invention provides no limitation thereto. Additionally, as shown in FIG. 5, a largest distance L2 is formed from each of the covering portions 563a and 563b to the edges SD1 and SD3 of the top surface 141 of the micro device 140. Preferably, a ratio of the largest distance L2 to the lengths of the edges SD1 and SD3 is smaller than or equal to 0.2. When the ratio is larger than 0.2, the holding force is too large, which affects subsequent picking-up and transferring processes. It should be indicated that the largest distance L2 may be smaller than or equal to 10 μm.

Figure 6A:
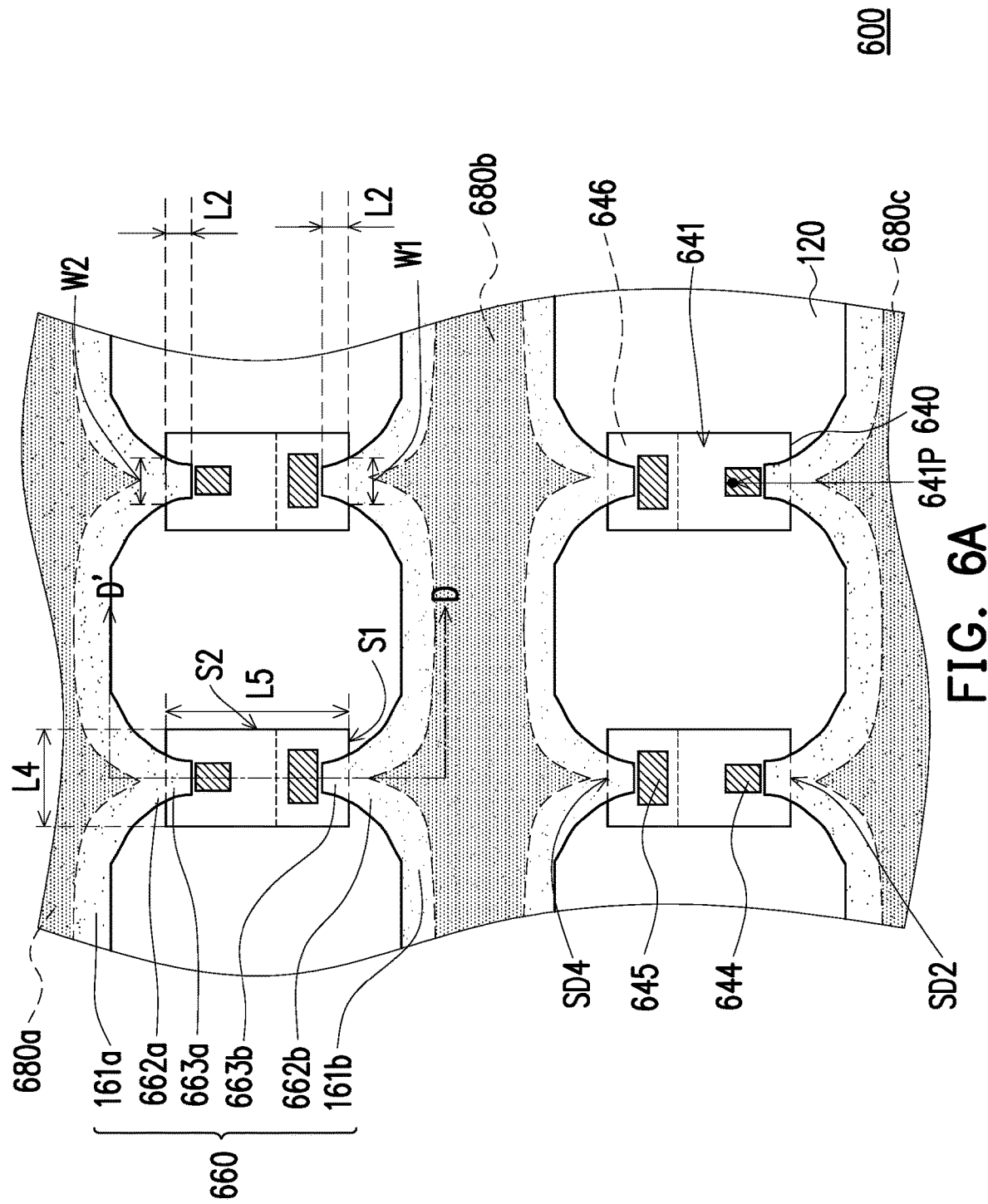
FIG. 6A is a schematic top view of a structure with micro device according to a sixth embodiment of the invention.
Figure 6B:
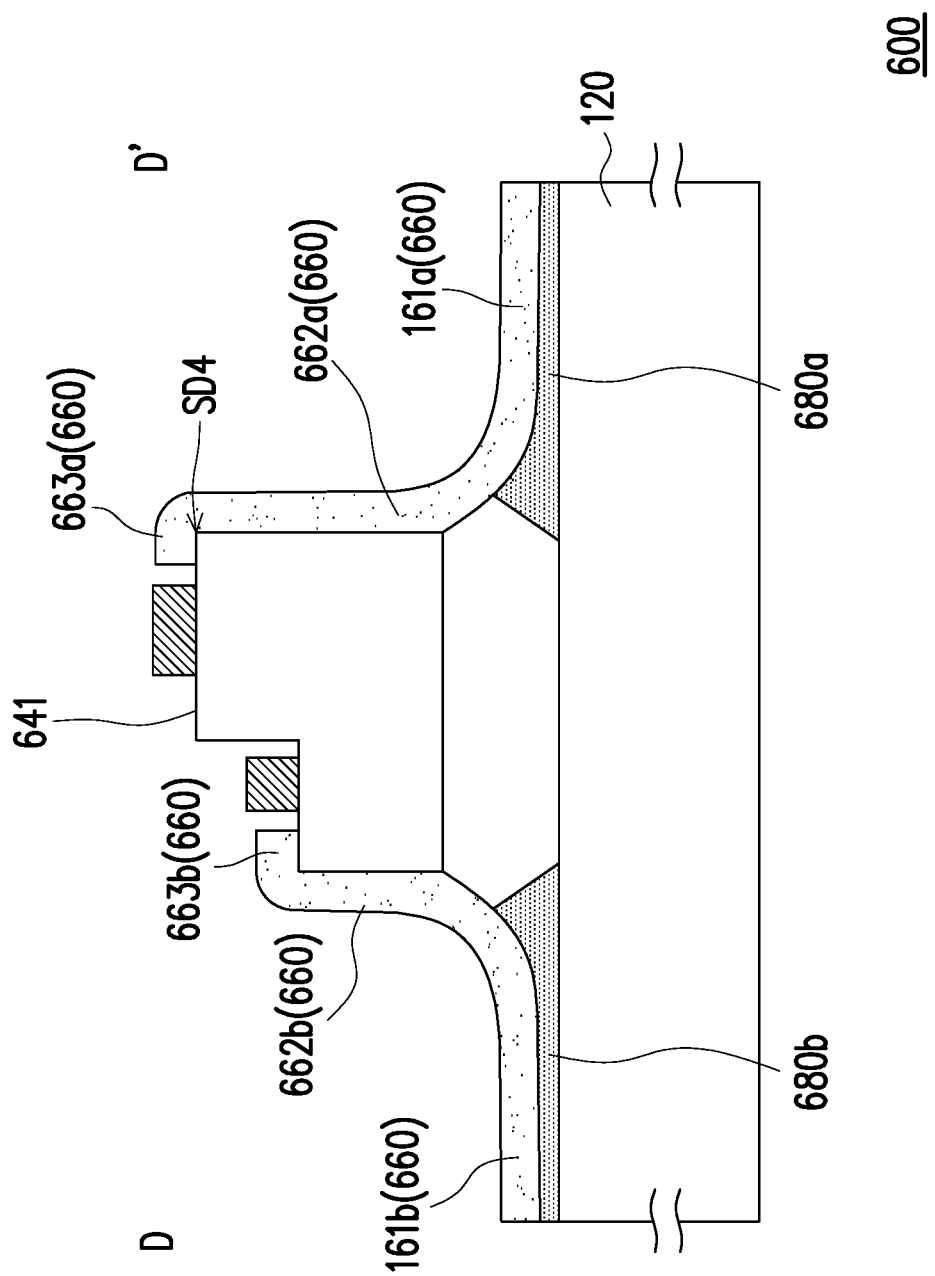
FIG. 6B is a schematic cross-sectional view of the structure with micro device in FIG. 6A.

FIG. 6A is a schematic top view of a structure with micro device according to a sixth embodiment of the invention. FIG. 6B is a schematic cross-sectional view of the structure with micro device in FIG. 6A. It should be indicated that FIG. 6B is illustrated along line D-D' of FIG. 6A. A structure with micro device 600 of the embodiment is similar to the structure with micro device 500 of the fifth embodiment, and the difference between the two is that a holding structure 660 of the embodiment is partially disposed on a top surface 641. More specifically, from a top view, a micro device 640 of the embodiment has a first lateral side S1 and a second lateral side S2 adjacent to each other. A length L4 of the first lateral side S1 is smaller than a length L5 of the second lateral side S2. Connecting portions 662a and 662b and covering portions 663a and 663b of the holding structure 660 are respectively disposed on the opposite first lateral side S1, that is, the holding structure 660 is disposed on a relatively shorter side of the micro device 640. With the configuration that the holding structure 660 is disposed on the relatively shorter side of the micro device 640, the micro device 640 can be arranged more intensively, thereby reducing the manufacturing cost of the micro device 640. It should be pointed out that, as shown in FIG. 6B, the holding structure 660 is not coplanar. Specifically, the connecting portions 662a and 662b as well as the covering portions 663a and 663b of the holding structure 660 are not in coplanar, thereby avoiding that the holding structure 660 is disposed on the height difference of the micro device 640 and increasing the process window of manufacturing process.

Additionally, the structure with micro device 600 of the embodiment further includes at least one buffering structure (a plurality of buffering structures 680a, 680b, 680c are exemplified in FIG. 6). The buffering structures 680a, 680b and 680c are disposed between the holding structure 660 and the substrate 120 such that the holding structure 660 is connected to the substrate 120 through the buffering structures 680a, 680b and 680c. In the embodiment, the configuration of the buffering structures 680a, 680b and 680c may be the same as or similar to the configuration of the buffering structure (e.g., buffering structures 280a, 280b in the second embodiment) in the foregoing embodiment, and related descriptions are omitted hereinafter.

Figure 7:
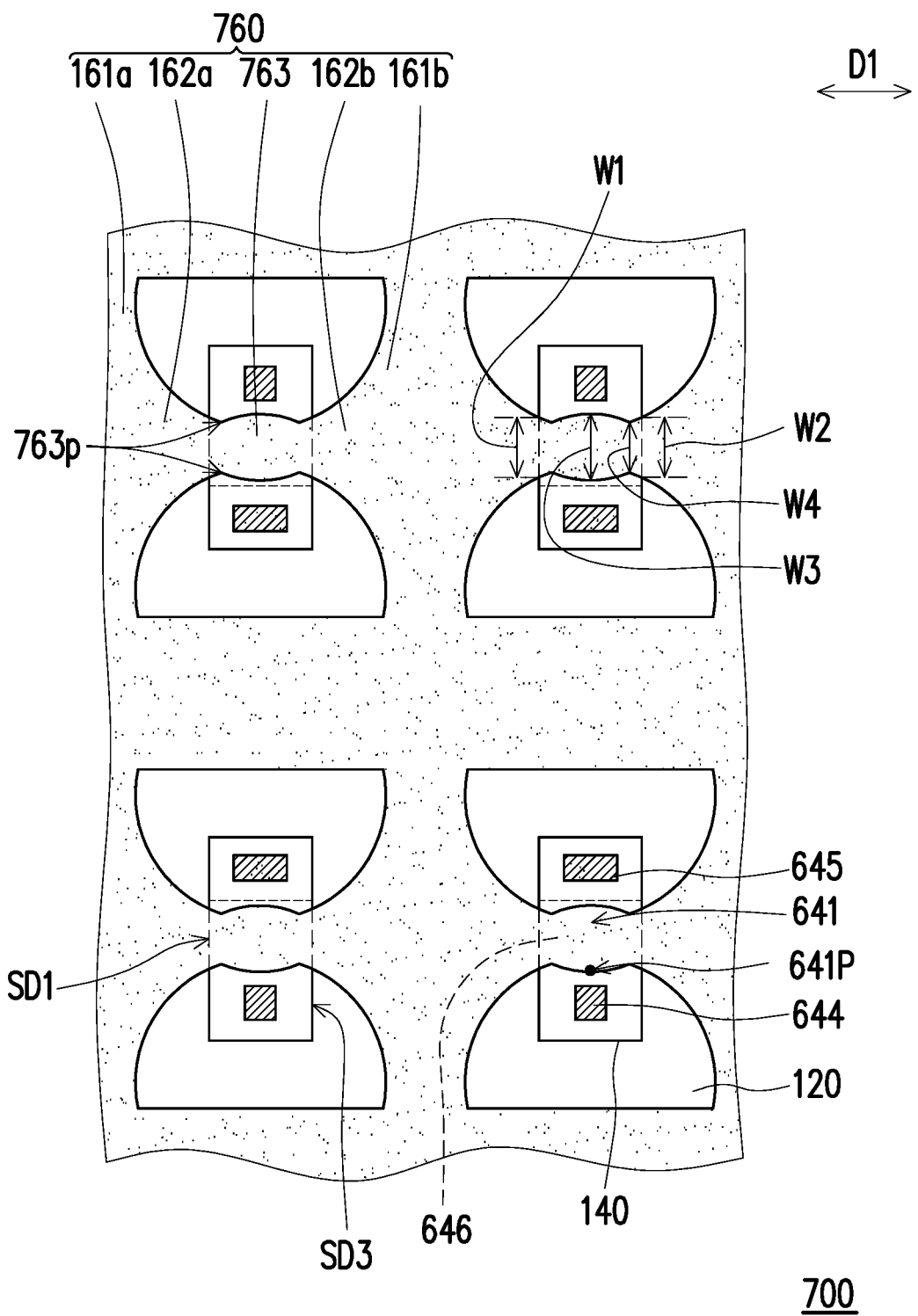
FIG. 7 is a schematic top view of a structure with micro device according to a seventh embodiment of the invention.

FIG. 7 is a schematic top view of a structure with micro device according to a seventh embodiment of the invention. A structure with micro device 700 of the embodiment is similar to the structure with micro device 100 of the first embodiment, and the difference between the two is that a covering portion 763 of a holding structure 760 in the embodiment has a plurality of inflection points 763p, and the width change of the covering portion 763 is gradually increased from the inflection points 763p to the connecting portions 162a and 162b. In other words, the covering portion 763 of the holding structure 760 has a smallest width W4 at the position of the inflection points 763p. Preferably, the central width W3 of the covering portion 763 is larger than widths (i.e., smallest widths W1, W2) of the connecting portions 162a and 162b at the corresponding edges SD1 and SD3 of the top surface 641, such that the first-type electrode 644 can be avoided and the covering portion 763 can be distributed on the overall top surface 641 of the micro device 140, thereby increasing flatness of the micro device 140 in subsequent transferring process. With the inflection points 763p, in the exposure and etching process for forming the holding structure 760, even if a slight shift is occurred unexpectedly, the holding structure 760 can still be disposed on the top surface 641 of the micro device 140 without being shifted to other position, and the connecting portions 162a and 162b of the holding structure 760 can have the narrowest width (i.e., smallest widths W1, W2) at the edges SD1 and SD3 of the micro device 140, thereby increasing the process window of the holding structure 760. It should be pointed out that the holding structure 760 herein passes through a center 641P of the top surface 641 such that the holding structure 760 can hold the micro device 140 more firmly.

Figure 8:
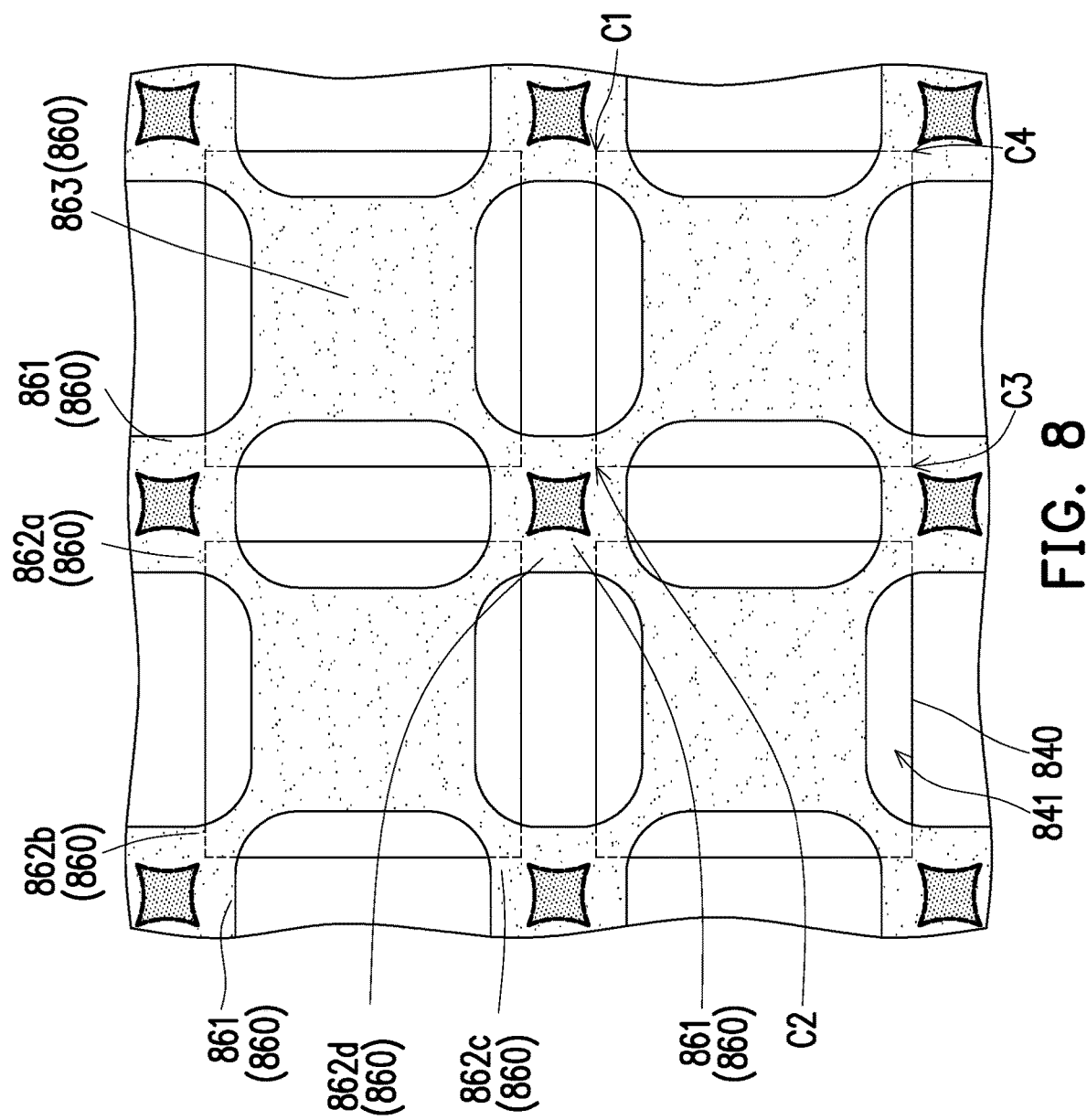
FIG. 8 is a schematic top view of a structure with micro device according to an eighth embodiment of the invention.

FIG. 8 is a schematic top view of a structure with micro device according to an eighth embodiment of the invention. A structure with micro device 800 of the embodiment is similar to the structure with micro device 400 of the fourth embodiment, and the difference between the two is that each of holding structures 860 of the embodiment has a plurality of connecting portions (four connecting portions 862a, 862b, 862c, 862d are exemplified in FIG. 8), and the connecting portions 862a, 862b, 862c, 862d are extended from corners C1, C2, C3, C4 of a micro device 840 and connected between a covering portion 863 and a holding portion 861.

From the top view direction, the connecting portions 862a, 862b, 862c, 862d are respectively directly in contact with the four corners C1, C2, C3, C4 of the top surface 841 of the micro device 840. Specifically, the connecting portion 862a is directly in contact with the corner C1 of the top surface 841 and connected to the holding portion 861 and the covering portion 863. The connecting portion 862b is directly in contact with the corner C2 of the top surface 841 and connected to the holding portion 861 and the covering portion 863. The connecting portion 862c is directly in contact with the corner C3 of the top surface 841 and connected to the holding portion 861 and the covering portion 863. The connecting portion 862d is directly in contact with the corner C4 of the top surface 841 and connected to the holding portion 861 and the covering portion 863. It should be indicated that, in the embodiment, the connecting portions 862a, 862b, 862c, 862d of the holding structure 860 are disposed at opposite corners of the top surface 841 of the micro device 840. In this manner, the space required for configuring a plurality of holding structures 860 can be saved, and the plurality of micro devices 840 can be arranged intensively, thereby reducing cost. It should be indicated that, in other embodiments that are not shown, the invention provides no limitation to the number of the corner of the micro device for configuring the holding structure. As long as the corner of the top surface of the micro device for configuring the holding structure allows the plurality of micro devices to be arranged intensively, it belongs the scope to be claimed in the invention.

Figure 9:
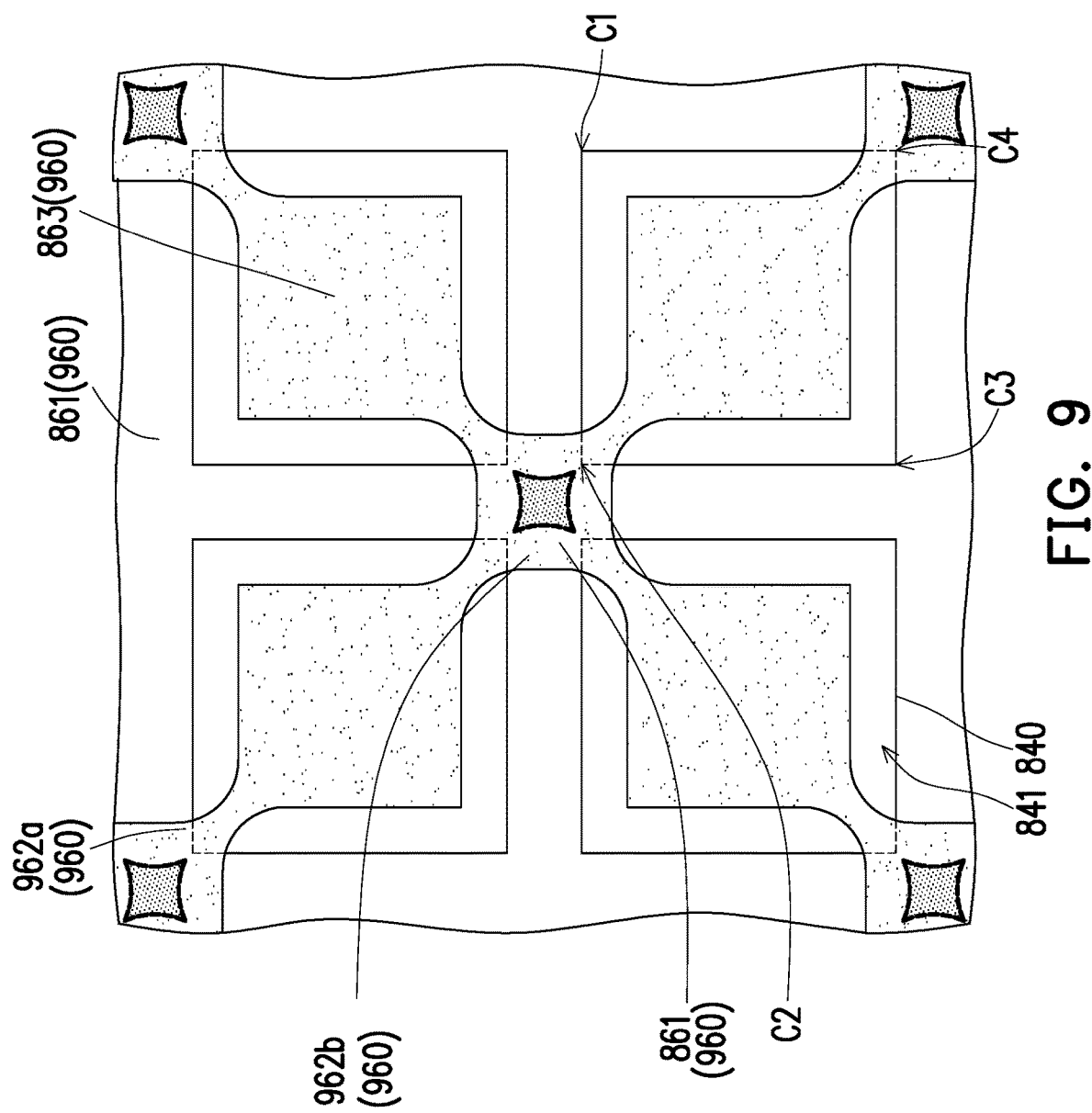
FIG. 9 is a schematic top view of a structure with micro device according to a ninth embodiment of the invention.

FIG. 9 is a schematic top view of a structure with micro device according to a ninth embodiment of the invention. A structure with micro device 900 of the embodiment is similar to the structure with micro device 800 in the eighth embodiment, and the difference between the two is that each of the holding structures 960 of the structure with micro device 900 of the embodiment has two connecting portions 962a and 962b. The connecting portion 962a is directly in contact with the corner C2 of the top surface 841 of the micro device 840 and connected to the holding portion 861 and the covering portion 863, and the connecting portion 962b is directly in contact with the corner C4 of the top surface 841 and connected to the holding portion 861 and the covering portion 863.

Figure 10:
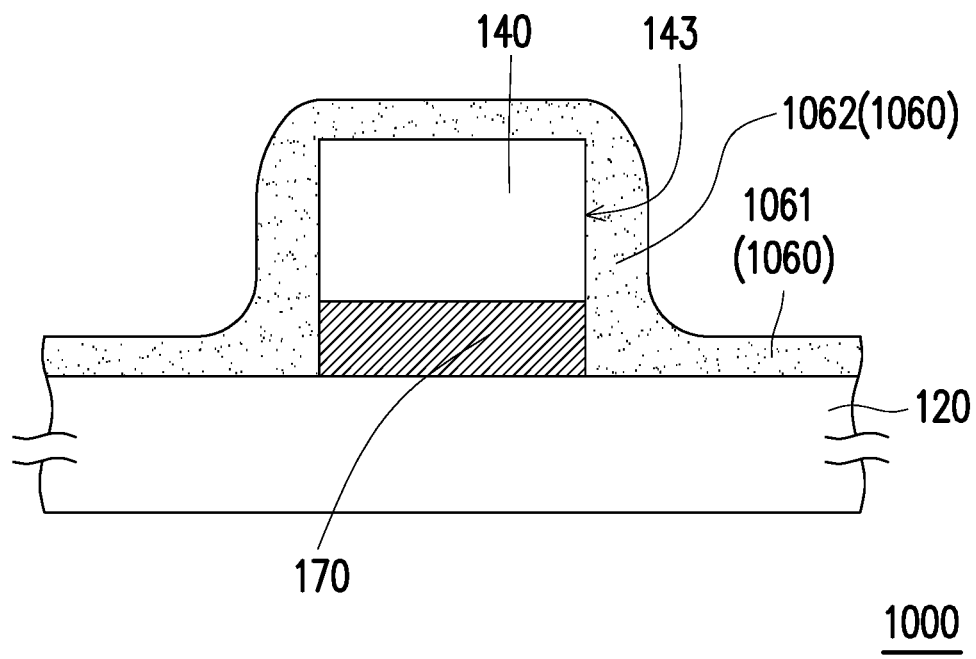
FIG. 10 is a schematic cross-sectional view of a structure with micro device according to a tenth embodiment of the invention.

FIG. 10 is a schematic cross-sectional view of a structure with micro device according to a tenth embodiment of the invention. Referring to FIG. 1B and FIG. 10, a structure with micro device 1000 of the embodiment is similar to the structure with micro device 100 of the first embodiment, and the difference between the two is that a buffering layer 170 is provided between the structure with micro device 1000 of the embodiment. In other words, there may be no air space between the micro device 140, a holding structure 1060 and the substrate 120 of the embodiment. Herein, a holding portion 1061 of the holding structure 1060 is directly in contact with the substrate 120, and a connecting portion 1062 of the holding structure 1060 is directly in contact with the peripheral surface 143 of the micro device 140. The buffering layer 170 is directly in contact with the holding structure 1060 and the micro device 140. The buffering layer 170 can absorb the stress generated when the micro device 140 is bonded to the substrate 120, thereby increasing the bonding yield rate. In other words, the buffering layer 170 can achieve the effect of buffering the stress between the micro device 140 and the substrate 120. Preferably, the Young's modulus of the buffering layer 170 is smaller than the Young's modulus of the holding structure 1060. Herein, the material of the buffering layer 170 includes a foam material or an organic polymer material, such that the buffering layer 170 has a plurality of irregular air pores, wherein the porosity of the buffering layer 170 constructed by the foam material may be larger than or equal to 50%, thereby providing a good buffering effect.

Figure 11:
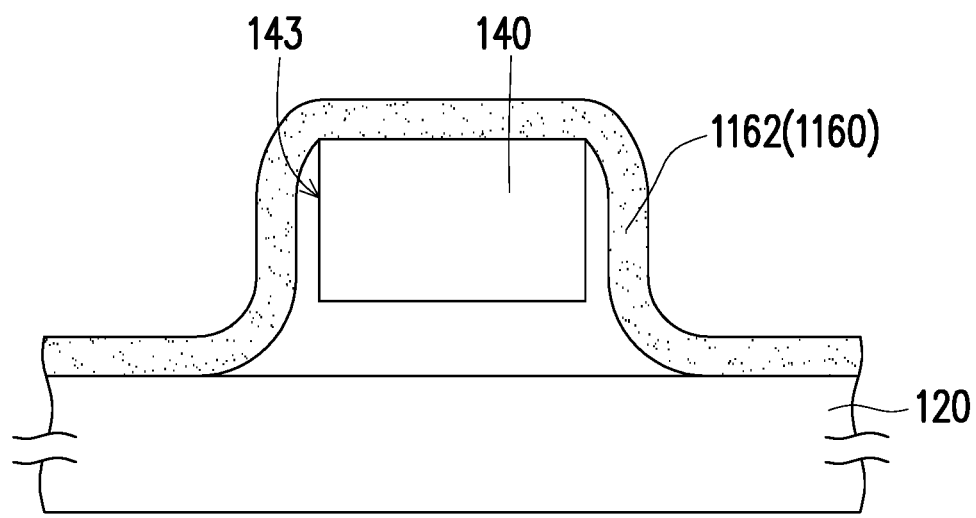
FIG. 11 is a schematic cross-sectional view of a structure with micro device according to an eleventh embodiment of the invention.

FIG. 11 is a schematic cross-sectional view of a structure with micro device according to an eleventh embodiment of the invention. Referring to FIG. 10 and FIG. 11, a structure with micro device 1100 of the embodiment is similar to the structure with micro device 1000 of the tenth embodiment, and the difference between the two is that a connecting portion 1162 of a holding structure 1160 of the structure with micro device 1100 of the embodiment is not directly in contact with the peripheral surface 143 of the micro device 140.

Figure 12:
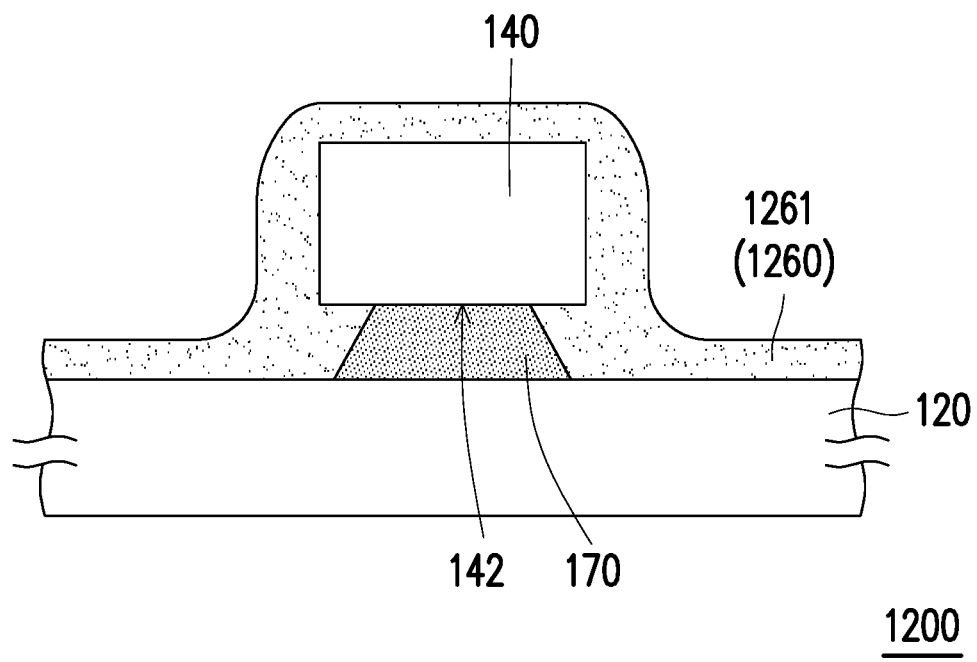
FIG. 12 is a schematic cross-sectional view of a structure with micro device according to a twelfth embodiment of the invention.

FIG. 12 is a schematic cross-sectional view of a structure with micro device according to a twelfth embodiment of the invention. Referring to FIG. 11 and FIG. 12, a structure with micro device 1200 of the embodiment is similar to the structure with micro device 1100 in the eleventh embodiment, and the difference between the two is that a holding portion 1261 of a holding structure 1260 of the embodiment is further extended and covers a portion of the bottom surface 142 of the micro device 140. In other words, the holding portion 1261 of the holding structure 1260 is extended to be in contact with the bottom surface 142 of the micro device 140.

Figure 13:
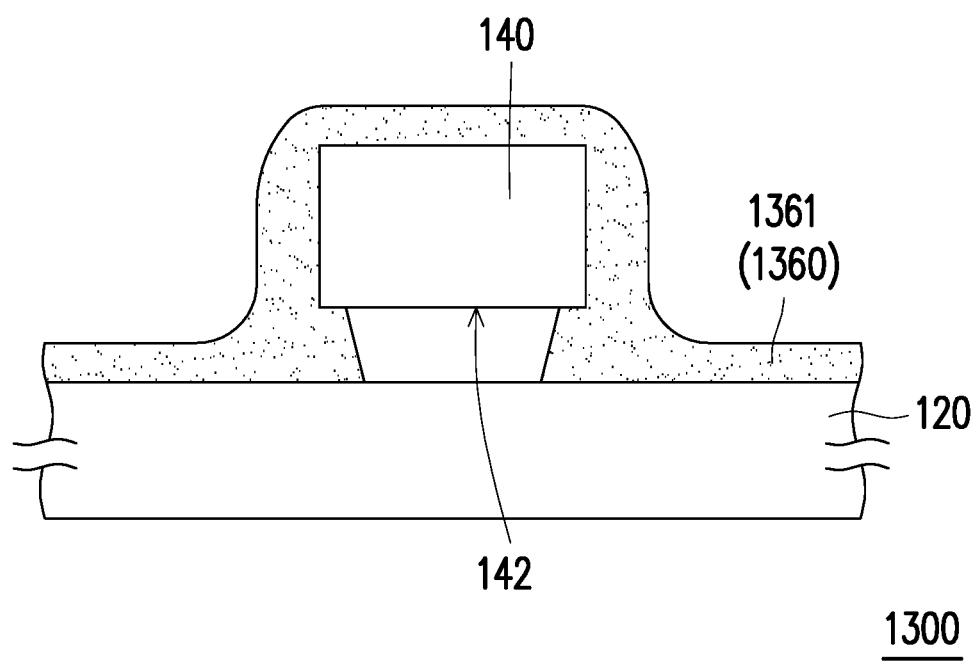
FIG. 13 is a schematic cross-sectional view of a structure with micro device according to a thirteenth embodiment of the invention.

FIG. 13 is a schematic cross-sectional view of a structure with micro device according to a thirteenth embodiment of the invention. Referring to FIG. 11 and FIG. 13, a structure with micro device 1300 of the embodiment is similar to the structure with micro device 1100 in the eleventh embodiment, and the difference between the two is that a holding portion 1361 of a holding structure 1360 of the embodiment is further extensively disposed on a portion of the bottom surface 142 of the micro device 140. In other words, the holding portion 1361 of the holding structure 1360 is extended to be in contact with the bottom surface 142 of the micro device 140.

Figure 14:
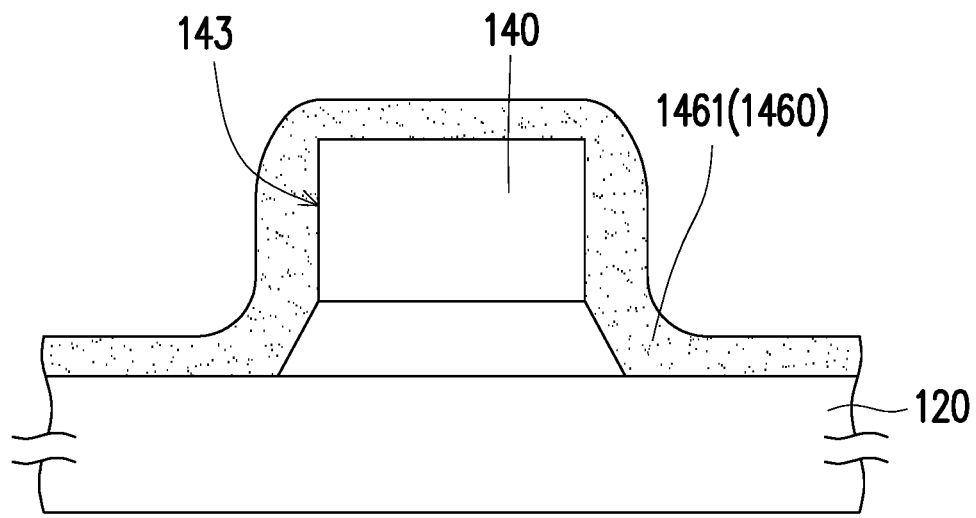
FIG. 14 is a schematic cross-sectional view of a structure with micro device according to a fourteenth embodiment of the invention.

FIG. 14 is a schematic cross-sectional view of a structure with micro device according to a fourteenth embodiment of the invention. Referring to FIG. 11 and FIG. 14, a structure with micro device 1400 of the embodiment is similar to the structure with micro device 1100 of the eleventh embodiment, and the difference between the two is that a holding portion 1461 of a holding structure 1460 of the embodiment is not aligned with the peripheral surface 143 of the micro device 140. In other words, the orthogonal projection of the micro device 140 on the substrate 120 does not overlap the orthogonal projection of the holding portion 1461 of the holding structure 1460 on the substrate 120.

Figure 15:
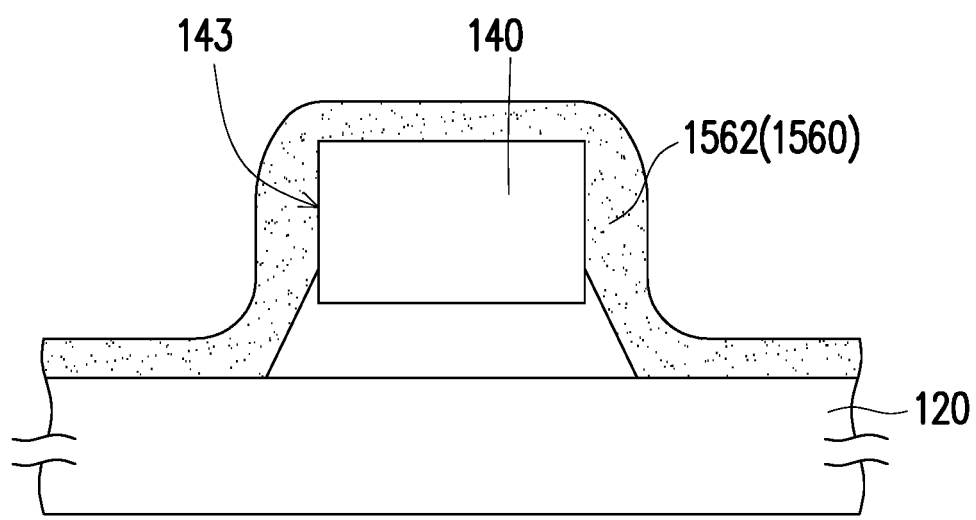
FIG. 15 is a schematic cross-sectional view of a structure with micro device according to a fifteenth embodiment of the invention.

FIG. 15 is a schematic cross-sectional view of a structure with micro device according to a fifteenth embodiment of the invention. Referring to FIG. 11 and FIG. 15, a structure with micro device 1500 of the embodiment is similar to the structure with micro device 1100 of the eleventh embodiment, and the difference between the two is that a connecting portion 1562 of a holding structure 1560 of the embodiment does not completely cover the peripheral surface 143 of the micro device 140. In other words, the connecting portion 1562 of the holding structure 1560 only covers a portion of the peripheral surface 143; therefore, the orthogonal projection of the micro device 140 on the substrate 120 does not overlap the orthogonal projection of the connecting portion 1562 of the holding structure 1560 on the substrate 120.

Figure 16:
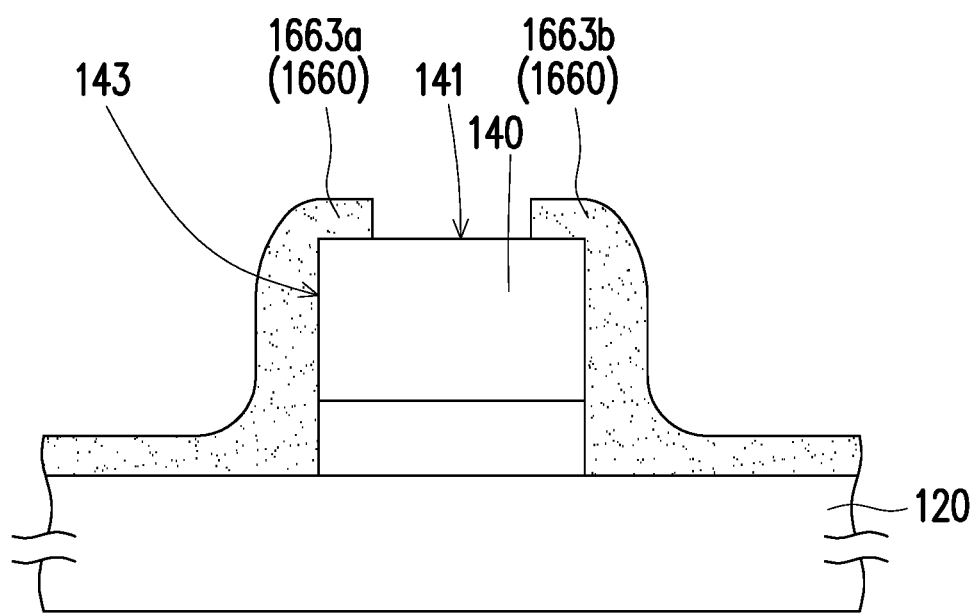
FIG. 16 is a schematic cross-sectional view of a structure with micro device according to a sixteenth embodiment of the invention.

FIG. 16 is a schematic cross-sectional view of a structure with micro device according to a sixteenth embodiment of the invention. Referring to FIG. 10 and FIG. 16, a structure with micro device 1600 of the embodiment is similar to the structure with micro device 1000 of the tenth embodiment, and the difference between the two is that covering portions 1663*a* and 1663*b* of a holding structure 1660 of the embodiment are plural and separated from each other.

Figure 17:
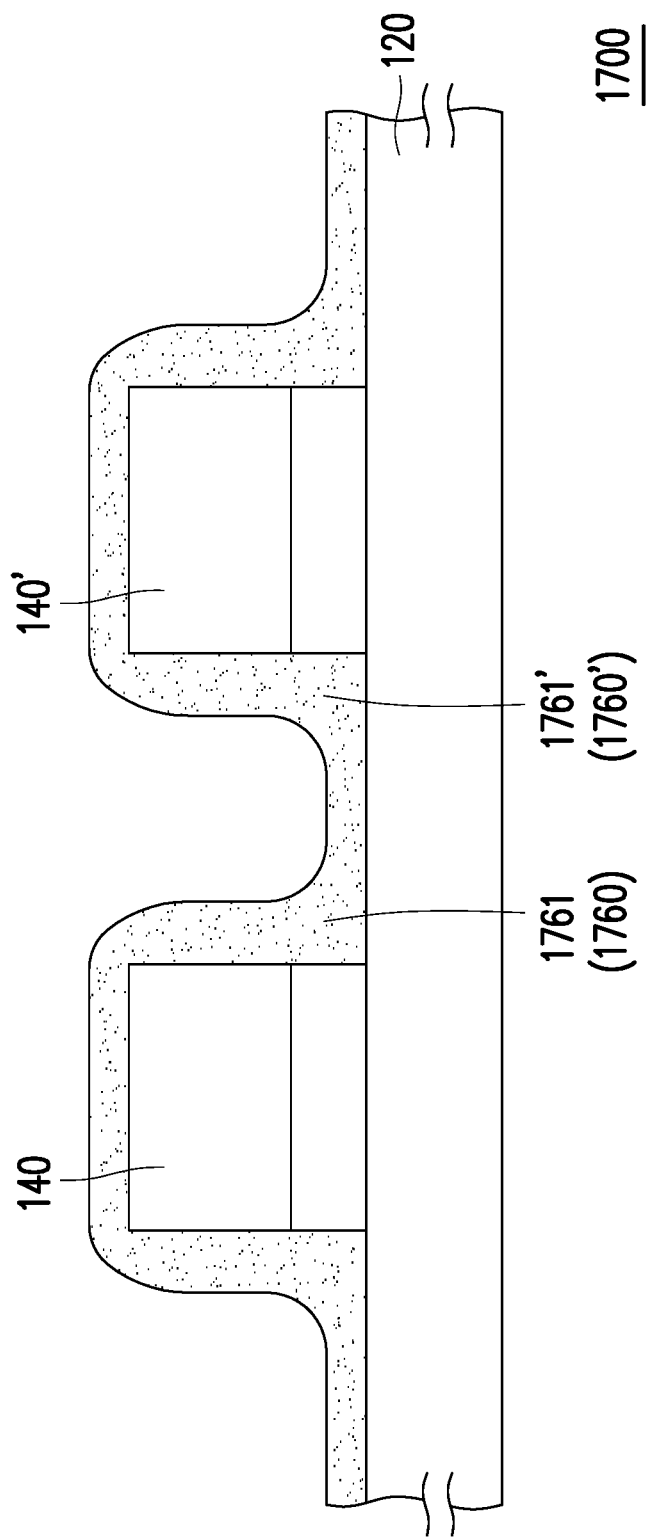
FIG. 17 is a schematic cross-sectional view of a structure with micro device according to a seventeenth embodiment of the invention.

FIG. 17 is a schematic cross-sectional view of a structure with micro device according to a seventeenth embodiment of the invention. Referring to FIG. 10 and FIG. 17, a structure with micro device 1700 of the embodiment is similar to the structure with micro device 1000 of the tenth embodiment, and the difference between the two is that, in the embodiment, two adjacent micro devices 140 and 140' are connected together through holding portions 1761 and 1761' of holding structures 1760 and 1760'. In the embodiments that are not shown, the holding portions 1761 and 1761' may not be connected together, the invention is not limited thereto.

Figure 18:
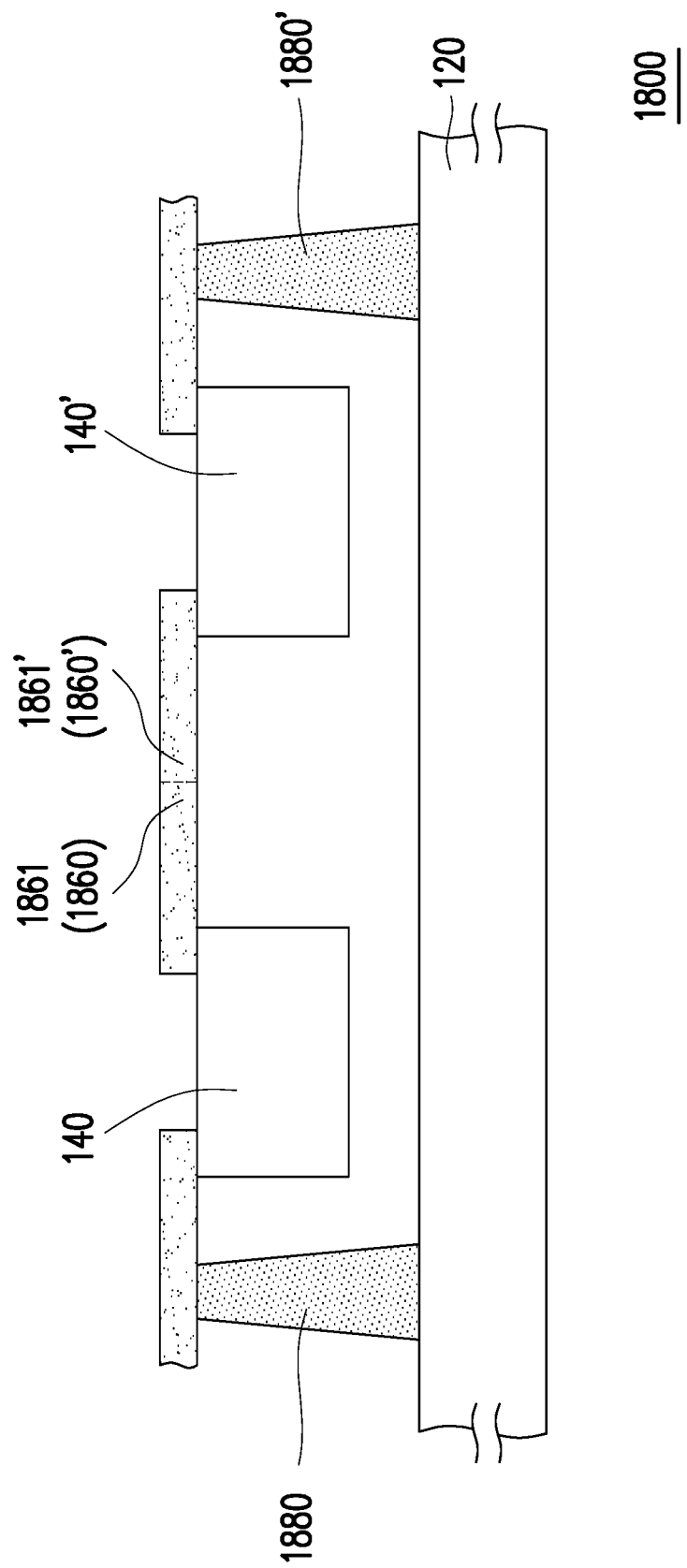
FIG. 18 is a schematic cross-sectional view of a structure with micro device according to an eighteenth embodiment of the invention.

FIG. 18 is a schematic cross-sectional view of a structure with micro device according to an eighteenth embodiment of the invention. Referring to FIG. 10 and FIG. 18, a structure 1800 with micro device of the embodiment is similar to the structure with micro device 1000 of the tenth embodiment, and the difference between the two is that the structure with micro device 1800 of the embodiment respectively further includes a plurality of buffering structures 1880 and 1880', wherein the holding structures 1860 and 1860' of the micro devices 140 and 140' are respectively connected to the substrate 120 through the buffering structures 1880 and 1880', and the two adjacent micro devices 140 and 140' are connected together through the holding portions 1861 and 1861' of the holding structures 1860 and 1860'.

Figure 19:
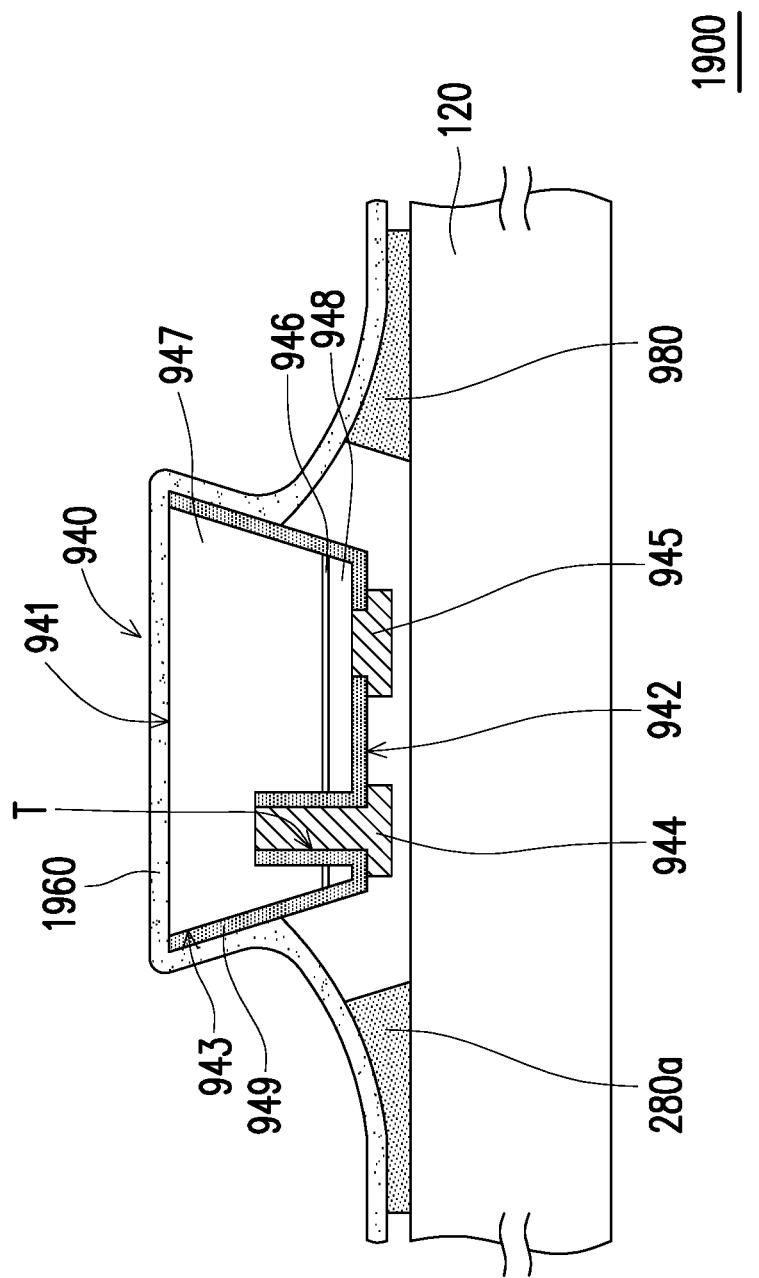
FIG. 19 is a schematic cross-sectional view of a structure with micro device according to a nineteenth embodiment of the invention.

FIG. 19 is a schematic cross-sectional view of a structure with micro device according to a nineteenth embodiment of the invention. Referring to FIG. 4B and FIG. 19, a micro device 940 of the structure with micro device 1900 of the embodiment includes a first-type semiconductor layer 947, a light emitting layer 946, a second-type semiconductor layer 948, an insulating layer 949, a through hole T, a first-type electrode 944 and a second-type electrode 945. Specifically, the through hole T penetrates through the second-type semiconductor layer 948, the light emitting layer 946 and a portion of the first-type semiconductor layer 947 in sequence. The insulating layer 949 covers the peripheral surface 943, a portion of the bottom surface 942 and the inner wall of the through hole T. The holding structure 1960 is directly in contact with the top surface 941 and the insulating layer 949 disposed on the peripheral surface 943. The first-type electrode 944 and the second-type electrode 945 are disposed on the bottom surface 942, and the first-type electrode 944 is filled in the through hole T and electrically connected to the first-type semiconductor layer 947, and the second-type electrode 945 passes through the insulting layer 949 of the bottom surface 942 and electrically connected to the second-type semiconductor layer 948.

More specifically, in the embodiment, the material of the holding structure 1960 is different from the material of the insulating layer 949. Herein, the material of the insulating layer 949 is, for example, silicon dioxide, silicon nitride, spin on glass (SOG) or similar material, the invention is not limited thereto. Preferably, the hardness of the holding structure 1960 is equal to or lower than the hardness of the insulating layer 949, and the thickness of the holding structure 1960 is smaller than or equal to the thickness of the insulating layer 949. In this manner, it can be avoided that the holding structure 1960 and the insulting layer 949 are removed simultaneously when the micro device 940 is transferred. Additionally, in the embodiment, the center of gravity of the holding structure 1960 is lower than the center of gravity of the micro device 940, and the holding structure 1960 on the top surface 941 of the micro device 940 has an angle that is the same as the angle of the holding structure 1960 on the peripheral surface 943, such that the micro device 940 can be fixed on the substrate 120 more effectively.

It should also be indicated that, when the micro devices 140, 140', 440, 640, 840 and 940 of the structures with micro device 100, 200, 300, 400, 500, 600, 700, 800, 900, 1000, 1100, 1200, 1300, 1400, 1500, 1600, 1700, 1800 and 1900 are picked up from the substrate 120 and delivered and transferred to be placed on a circuit substrate 2020 (refer to FIG. 20), only a portion of the holding structures 160, 260, 360, 460, 560, 660, 760, 860, 960, 1060, 1160, 1260, 1360, 1460, 1560, 1660, 1760, 1760', 1860, 1860' and 1960 still cover the top surfaces 141, 441, 641, 841 and 941 or a portion of the peripheral surfaces 143 and 943 of the micro devices 140, 140', 440, 640, 840 and 940, related embodiments are provided below.

Figure 20:
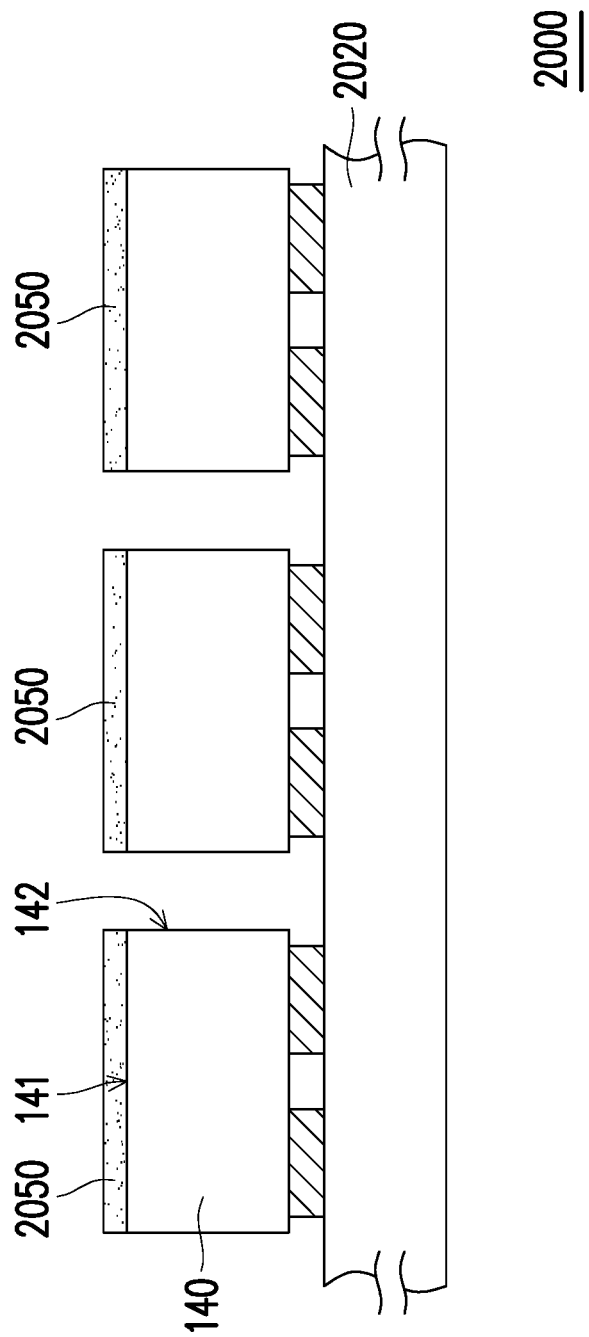
FIG. 20 is a schematic cross-sectional view of a structure with micro device transferred to a circuit substrate according to an embodiment of the invention.

FIG. 20 is a schematic cross-sectional view of a structure with micro device transferred to a circuit substrate according to an embodiment of the invention. Referring to FIG. 20, a plurality of micro devices 140 are transferred to the circuit substrate 2020 to form an apparatus with micro device 2000. The apparatus with micro device 2000 is, for example, a micro LED display or other electronic facility having display. Herein, the micro device 140 is shown as a flip-chip micro LED and may be an LED having same color light or an LED having different color light, the invention provides no limitation thereto. In other words, the micro device 140 is electrically connected to the circuit substrate 2020 in the flip-chip manner. The holding structure that is originally disposed on the top surface 141 of the micro device 140 may remain only a portion, i.e., a light guide structure 2050, after the micro device 140 is picked up. In some embodiments that are not shown, the light guide structure may be simultaneously disposed on the top surface and a portion of peripheral surface of the micro device. Herein, the circuit substrate 2020 may be, for example, a display back panel or other substrate having circuit.

Figure 21:
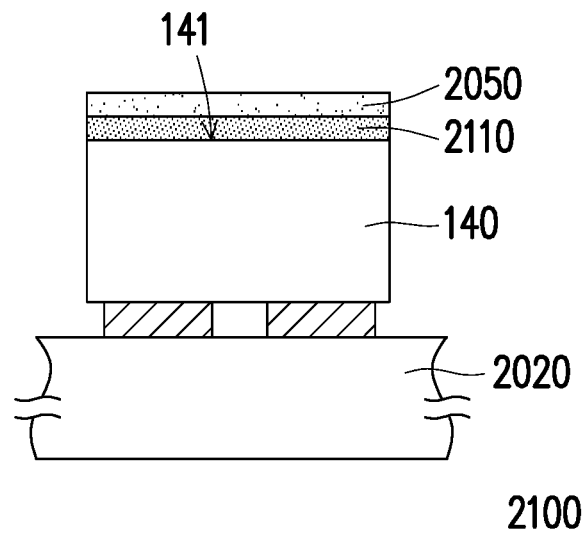
FIG. 21 is a schematic cross-sectional view of a structure with micro device transferred to a circuit substrate according to another embodiment of the invention.

FIG. 21 is a schematic cross-sectional view of a structure with micro device transferred to a circuit substrate according to another embodiment of the invention. Referring to FIG. 20 and FIG. 21, an apparatus with micro device 2100 of the embodiment is similar to the apparatus with micro device 2000 in FIG. 20, and the difference between the two is that the apparatus with micro device 2100 of the embodiment further includes a light guide layer 2110. Specifically, the light guide layer 2110 is disposed on the micro device 140, and a light guide structure 2050 and the micro device 140 are respectively disposed on two opposite sides of the light guide layer 2110, wherein the light guide layer 2110 is directly in contact with the top surface 141 of the micro device 140. Preferably, the light guide layer 2110 is conformally disposed on the micro device 140, and the light guide structure 2050 is conformally disposed on the light guide layer 2110.

In the embodiment, the reflective index of the micro device 140 may be larger than the reflective index of the light guide layer 2110, and/or the reflective index of the light guide layer 2110 may be larger than or equal to the reflective index of the light guide structure 2050. In this manner, it can be avoided that the light emitted by the micro device 140 generates total reflection on the interface between the light guide layer 2110 and the micro device 140 and/or on the interface between the light guide structure 2050 and the light guide layer 2110, thereby improving light output ratio of the micro device 140. Herein, the material of the light guide layer 2110 may be different from the material of the micro device 140 of the light guide structure 2050, wherein the material of the light guide layer 2110 is, for example, silicon dioxide, silicon nitride, spin on glass (SOG) or a combination thereof, the invention is not limited thereto. Additionally, the Young's modulus of the light guide layer 2110 of the embodiment is smaller than the Young's modulus of the micro device 140. The orthogonal projection area of the light guide structure 2050 on the top surface 141 of the micro device 140 is equal to the orthogonal projection area of the light guide layer 2110 on the top surface 141, the invention is not limited thereto.

Figure 22:
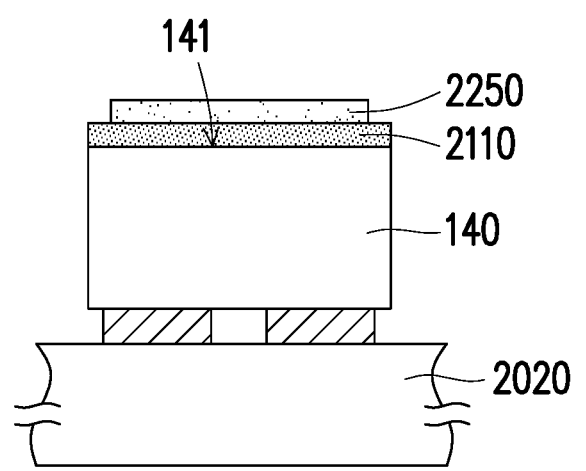
FIG. 22 is a schematic cross-sectional view of a structure with micro device transferred to a circuit substrate according to still another embodiment of the invention.

FIG. 22 is a schematic cross-sectional view of a structure with micro device transferred to a circuit substrate according to still another embodiment of the invention. Referring to FIG. 21 and FIG. 22, an apparatus with micro device 2200 in the embodiment is similar to the apparatus with micro device 2100 in FIG. 21, and the difference between the two is that the orthogonal projection area of a light guide structure 2250 of the apparatus with micro device 2200 on the top surface 141 of the embodiment is smaller than the orthogonal projection area of the light guide layer 2110 on the top surface 141. Preferably, a ratio of the orthogonal projection area of the light guide structure 2250 on the top surface 141 to the orthogonal projection area of the light guide layer 2110 on the top surface 141 is in the range between 0.8 and 1.

In summary, in the design of the structure with micro device of the invention, from the top view direction, the connecting portion of the holding structure is extended along a horizontal direction and connected between the covering portion and the holding portion, and the width change of the connecting portion is gradually increased from the edge or corner of the micro device to the holding portion. That is to say, the connecting portion of the holding structure may have the narrowest width at the edge or in the corner of the micro device. With such design, when the micro device is delivered and transferred between different temporary substrates, it can be controlled that the breaking point of the holding structure can be as close to the edge or corner of the micro device as possible, thereby reducing the problem that the holding structure is not completely broken or remained, such that the yield rate of delivery and transfer of the micro LED can be improved.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A structure with micro device, comprising:
   a substrate;
   at least one micro device, disposed on the substrate, and having a top surface away from the substrate; and
   at least one holding structure, disposed on the substrate, and the holding structure comprising:
      at least one connecting portion, disposed on at least one edge of the micro device;
      at least one holding portion, connecting the connecting portion and extending to the substrate, wherein from a top view direction, a width of the connecting portion is gradually increased from the edge of the micro device to the holding portion; and
      at least one covering portion, disposed on the top surface of the micro device, wherein from the top view direction, the connecting portion is connected between the covering portion and the holding portion.

2. The structure with micro device according to claim 1, wherein from the top view direction, an outer counter of the connecting portion of the holding structure is a curved contour.

3. The structure with micro device according to claim 1, wherein from a top view direction, an outer contour of the connecting portion of the holding structure is a linear contour.

4. The structure with micro device according to claim 1, wherein the micro device comprises a first-type electrode and a second-type electrode, and the first-type electrode and the second-type electrode are disposed on a bottom surface opposite to the top surface.

5. The structure with micro device according to claim 4, wherein a ratio of an orthogonal projection area of the holding structure on the top surface to an area of the top surface of the micro device is larger than or equal to 0.5 and smaller than 1.

6. The structure with micro device according to claim 1, wherein the micro device comprises a first-type electrode and a second-type electrode, and the first-type electrode or the second-type electrode is disposed on the top surface.

7. The structure with micro device according to claim 6, wherein a ratio of an orthogonal projection area of the holding structure on the top surface to an area of the top surface of the micro device is larger than or equal to 0.01 and smaller than or equal to 0.5.

8. The structure with micro device according to claim 1, wherein a central width of the covering portion is larger than a width of the connecting portion on the corresponding edge of the top surface.

9. The structure with micro device according to claim 8, wherein the covering portion has a plurality of inflection points, and a width of the covering portion is gradually increased from the inflection points to the connecting portion.

10. The structure with micro device according to claim 1, wherein a central width of the covering portion is smaller than a width of the connecting portion on the corresponding edge of the top surface.

11. The structure with micro device according to claim 10, wherein a width of the covering portion is gradually increased toward the connecting portion.

12. The structure with micro device according to claim 1, wherein the at least one covering portion comprises a plurality of covering portions, and the covering portions are separated from each other.

13. The structure with micro device according to claim 12, wherein smallest distances from a center of the top surface of the micro device to each of the covering portions are the same.

14. The structure with micro device according to claim 12, wherein smallest distances from a center of the top surface of the micro device to each of the covering portions are smaller than or equal to a shortest length of half of the top surface.

15. The structure with micro device according to claim 12, wherein a largest distance is formed from each of the covering portions to the edge of the top surface, and a ratio of the largest distance to a length of the corresponding edge of the micro device is smaller than or equal to 0.2.

16. The structure with micro device according to claim , wherein a ratio of the width of the connecting portion at the edge to a length of the edge is in a range between 0.01 and 0.6.

17. The structure with micro device according to claim 1, further comprising:
    at least one buffering structure, disposed between the holding portion of the holding structure and the substrate, wherein the holding portion is connected to the substrate through the buffering structure.

18. The structure with micro device according to claim 17, wherein a material of the holding structure is different from a material of the buffering structures, and the Young's modulus of the holding structure is larger than the Young's modulus of the buffering structure.

19. The structure with micro device according to claim 17, wherein the buffering structure is away from the micro device.

20. The structure with micro device according to claim 19, wherein a smallest distance is formed between an orthogonal projection of the buffering structure on the substrate and an orthogonal projection of the micro device on the substrate, and the smallest distance is smaller than or equal to 10 µm.

21. The structure with micro device according to claim 17, wherein in a unit area, a ratio of an orthogonal projection area of the buffering structure on the substrate to an orthogonal projection area of the holding structure on the substrate is in a range between 0.2 and 0.9.

* * * * *